US010102938B2

(12) United States Patent
Yabu et al.

(10) Patent No.: US 10,102,938 B2
(45) Date of Patent: Oct. 16, 2018

(54) EXTREME ULTRAVIOLET LIGHT GENERATING APPARATUS

(71) Applicant: Gigaphoton Inc., Tochigi (JP)

(72) Inventors: Takayuki Yabu, Oyama (JP); Tamotsu Abe, Oyama (JP); Kenichi Miyao, Oyama (JP); Tooru Abe, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 15/953,774

(22) Filed: Apr. 16, 2018

(65) Prior Publication Data

US 2018/0240562 A1    Aug. 23, 2018

Related U.S. Application Data

(63) Continuation of application No. PCT/JP2016/081825, filed on Oct. 27, 2016.

(30) Foreign Application Priority Data

Nov. 3, 2015 (WO) .................. PCT/JP2015/080971

(51) Int. Cl.
G21K 1/06 (2006.01)
H05G 2/00 (2006.01)
G03F 7/00 (2006.01)
G03F 7/20 (2006.01)

(52) U.S. Cl.
CPC .......... G21K 1/062 (2013.01); G03F 7/70033 (2013.01); G03F 7/7055 (2013.01);
(Continued)

(58) Field of Classification Search
CPC ............ G03F 7/70033; G03F 7/70525; G03F 7/7055; G21K 1/062; H05G 2/008
See application file for complete search history.

(56) References Cited

U.S. PATENT DOCUMENTS

2012/0175533 A1   7/2012  Moriya et al.
2012/0228525 A1   9/2012  Moriya et al.
(Continued)

FOREIGN PATENT DOCUMENTS

JP    2012-134447 A    7/2012
JP    2012-199512 A    10/2012
(Continued)

OTHER PUBLICATIONS

International Search Report issued in corresponding International Application No. PCT/JP2016/081825; dated Jan. 24, 2017.
(Continued)

Primary Examiner — Mark R Gaworecki
(74) Attorney, Agent, or Firm — Studebaker & Brackett PC

(57) ABSTRACT

An extreme ultraviolet light generating apparatus may include a chamber including a window to allow first and second pulse laser beams to enter, a mirror to reflect the first pulse laser beam, a first actuator to control a position or a posture of the mirror, a beam combiner to cause optical paths of the first and second pulse laser beams to substantially coincide with each other, a reflective optical system to reflect the first and second pulse laser beams from the beam combiner, a second actuator to control a position or a posture of the reflective optical system, sensors each configured to output data for detecting a position of an optical path of the first pulse laser beam, and a controller to control the first actuator based on the data and control the second actuator based on a value related to control of the first actuator.

20 Claims, 15 Drawing Sheets

(52) U.S. Cl.
CPC ........ *G03F 7/7085* (2013.01); *G03F 7/70525* (2013.01); *H05G 2/008* (2013.01)

(56) References Cited

U.S. PATENT DOCUMENTS

| | | |
|---|---|---|
| 2013/0015319 A1 | 1/2013 | Moriya et al. |
| 2013/0043401 A1 | 2/2013 | Graham et al. |
| 2013/0105713 A1 | 5/2013 | Watanabe et al. |
| 2015/0261095 A1 | 9/2015 | Jansen et al. |
| 2016/0135276 A1 | 5/2016 | Abe et al. |

FOREIGN PATENT DOCUMENTS

| | | | |
|---|---|---|---|
| JP | 2013-069655 A | 4/2013 | |
| JP | 2014-534559 A | 12/2014 | |
| JP | 2015-015251 A | 1/2015 | |
| JP | WO 2015029137 A1 * | 3/2015 | ............ H05G 2/003 |
| WO | 2015/029137 A1 | 3/2015 | |

OTHER PUBLICATIONS

International Preliminary Report on Patentability issued in corresponding International Application No. PCT/JP2016/081825; dated May 8, 2018.

International Search Report issued in corresponding International Application No. PCT/JP2015/080971; dated Jan. 19, 2016.

International Preliminary Report on Patentability issued in corresponding International Application No. PCT/JP2015/080971; dated May 8, 2018.

* cited by examiner

EXTREME ULTRAVIOLET LIGHT GENERATING APPARATUS

TECHNICAL FIELD

The present disclosure relates to an extreme ultraviolet light generating apparatus.

BACKGROUND ART

In recent years, as semiconductor processes become finer, transfer patterns for use in photolithography of semiconductor processes have rapidly become finer. In the next generation, micro-fabrication at 70 nm to 45 nm, and further, micro-fabrication at 32 nm or less would be demanded. In order to meet the demand for, for example, micro-fabrication at 32 nm or less, it is expected to develop an exposure apparatus in which an extreme ultraviolet light generating apparatus for generating extreme ultraviolet MAO light at a wavelength of approximately 13 nm is combined with a reduced projection reflective optical system.

Three types of EUV light generating apparatuses have been proposed, which include an LPP (laser produced plasma) type apparatus using plasma generated by irradiating target material with a pulse laser beam, a DPP (discharge produced plasma) type apparatus using plasma generated by an electric discharge, and an SR (synchrotron radiation type apparatus using synchrotron radiation.

Patent Document 1: US Patent Application Publication No. 2013/0043401 A

Patent Document 2: International Publication No. WO2015/029137 A

SUMMARY

An extreme ultraviolet light generating apparatus according to an aspect of the present disclosure may include: a chamber including a window configured to allow a first pulse laser beam with which a target is irradiated at a predetermined region to generate a secondary target and a second pulse laser beam with which the secondary target is irradiated at the predetermined region to generate plasma to enter; a mirror configured to reflect the first pulse laser beam; a first actuator configured to control at least one of a position and a posture of the mirror; a beam combiner configured to cause optical paths of the first pulse laser beam reflected by the mirror and the second pulse laser beam to substantially coincide with each other to output the first pulse laser beam and the second pulse laser beam; a reflective optical system configured to reflect the first pulse laser beam and the second pulse laser beam outputted from the beam combiner toward the predetermined region; a second actuator configured to control at least one of a position and a posture of the reflective optical system; sensors each configured to output data for detecting a position of an optical path of the first pulse laser beam in the vicinity of the predetermined region; and a controller configured to control the first actuator based on the data and control the second actuator based on a value related to control of the first actuator.

BRIEF DESCRIPTION OF DRAWINGS

Embodiments of the present disclosure will be described below as mere examples with reference to the appended drawings.

FIG. 8 further shows time-dependent changes in the position of the optical path adjusted by a high-speed actuator 411 and the actuator 84 for the laser beam focusing optical system. FIG. 8 further shows time-dependent changes in a range of adjustment of the optical path with the high-speed actuator 411.

DESCRIPTION OF EMBODIMENTS

Contents
1. Overall Description of Extreme Ultraviolet Light Generating System
    1.1 Configuration
    1.2 Operation
2. EUV Light Generating Apparatus of Comparative Example
    2.1 Configuration
        2.1.1 Target Supply Unit
        2.1.2 Laser Apparatus
        2.1.3 Laser Beam Direction Control Unit
        2.1.4 Laser Beam Focusing Optical System
        2.1.5 EUV Light Sensor
    2.2 Operation
        2.2.1 Outputting Target
        2.2.2 Generating Plasma
        2.2.3 Detecting EUV Mass Center
    2.3 Problem
3. Beam Combiner Module Capable of Adjusting Optical Path
    3.1 Configuration
    3.2 Operation and Function
    3.3 Effect
4. Beam Combiner Module Including Plurality of Actuators
5. EUV Light Generating Apparatus Including Plurality of Target Cameras
    5.1 Configuration
    5.2 Operation
6. EUV Light Generating Apparatus to Irradiate One Target with Two Pre-Pulse Laser Beams and One Main Pulse Laser Beam
    6.1 Configuration
    5.2 Operation
    6.3 Effect
7. EUV Light Generating Apparatus Performing Long-Distance Delivery of Two Pre-Pulse Laser Beams and One Main Pulse Laser Beam
    7.1 Configuration
    7.2 Operation
    7.3 Effect
8. Configuration of Controller Embodiments of the present disclosure will be described in detail below with reference to the drawings. The embodiments described below may indicate several examples of the present disclosure and may not intend to limit the content of the present disclosure. Not all of the configurations and operations described in the embodiments are indispensable in the present disclosure. Identical reference symbols may be assigned to identical constituent elements and redundant descriptions thereof may be omitted.

Figure 1:
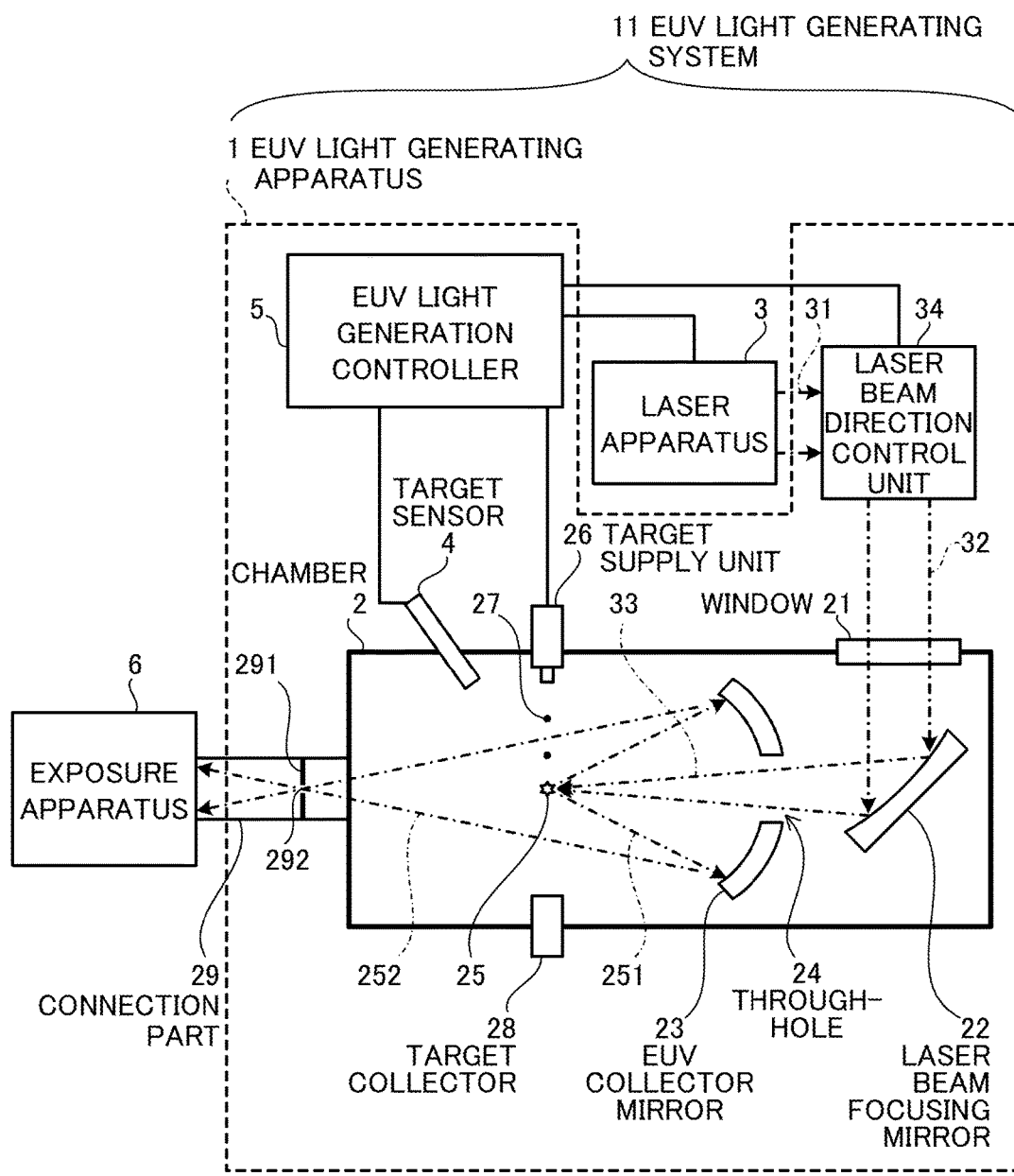
FIG. 1 schematically shows an exemplary configuration of an LPP type EUV light generating system.

1. Overall Description of Extreme Ultraviolet Light Generating System
    1.1 Configuration FIG. 1 schematically shows an exemplary configuration of an LFP type EUV light generating system. An EUV light generating apparatus 1 may be used with at least one Laser apparatus 3. In the present application, a system including the EUV light generating apparatus 1 and the laser apparatus 3 may be referred to as an EUV light generating system 11. As shown in FIG. 1 and described in detail below, the EUV light generating apparatus 1 may include a chamber 2 and a target supply unit 26. The chamber 2 may be sealed airtight. The target supply unit 26 may be provided, for example, to penetrate a wall of the chamber 2. A target material supplied by the target supply unit 26 may include, but not be limited to, tin, terbium, gadolinium, lithium, or a combination of any two or more of them.

The chamber 2 may have at least one through-hole formed in its wall. A window 21 may be provided at the through-hole. A pulse laser beam 32 outputted from the laser apparatus 3 may be transmitted by the window 21. An EUV collector mirror 23 having a spheroidal reflective surface, for example, may be provided in the chamber 2. The EUV collector mirror 23 may have first and second focal points. The surface of the EUV collector mirror 23 may have, for example, a multi-layered reflective film in which molybdenum layers and silicon layers are alternately laminated. The EUV collector mirror 23 is preferably arranged such that, for example, the first focal point is positioned in a plasma generation region 25 and the second focal point is positioned in an intermediate focus region (IF) 292. The EUV collector mirror 23 may have a through-hole 24 at the center thereof, and a pulse laser beam 33 may pass through the through-hole 24.

The EUV light generating apparatus 1 may further include an EUV light generation controller 5 and a target sensor 4. The target sensor 4 may have a photographing function and may be configured to detect the presence, actual path, position, speed or the like of a target 27.

Further, the EUV light generating apparatus 1 may include a connection part 29 for allowing the interior of the chamber 2 to be in communication with the interior of an exposure apparatus 6. In the connection part 29, a wall 291 with an aperture may be provided. The wall 291 may be positioned such that the second focal point of the EUV collector mirror 23 lies in the aperture formed in the wall 291.

Furthermore, the EUV light generating apparatus 1 may include a laser beam direction control unit 34, a laser beam focusing mirror 22, a target collector 28 for collecting the target 27, and the like. The laser beam direction control unit 34 may include an optical system for defining the traveling direction of the pulse laser beam and an actuator for adjusting the position, the posture, or the like of the optical system.

1.2 Operation

With continued reference to FIG. 1, a pulse laser beam 31 outputted from the laser apparatus 3 may enter the laser beam direction control unit 34 and be outputted therefrom as the pulse laser beam 32. The pulse laser beam 32 may be transmitted by the window 21 to enter the chamber 2. The pulse laser beam 32 may travel inside the chamber 2 along at least one laser beam optical path, be reflected by the laser beam focusing mirror 22, and be incident on the target 27 as the pulse laser beam 33.

The target supply unit 26 may be configured to output the target 27 toward the plasma generation region 25 in the chamber 2. The target 27 may be irradiated with at least one pulse of the pulse laser beam 33. The target 27 irradiated with the pulse laser beam 33 may be turned into plasma that emits rays of light 251. EUV light included in the rays of light 251 may be reflected by the EUV collector mirror 23 at a higher reflectance than light in other wavelength regions. Reflected light 252 including the EUV light reflected by the EUV collector mirror 23 may be collected at the intermediate focus region 292 and outputted to the exposure apparatus 5.

The EUV light generation controller 5 may be configured to integrally control the EUV light generating system 11. The EUV light generation controller 5 may process image data or the like of the target 27 photographed by the target sensor 4. Further, the EUV light generation controller 5 may control the timing at which the target 27 is outputted, the direction in which the target 27 is outputted, and the like. Furthermore, the EUV light generation controller 5 may control the oscillation timing of the laser apparatus 3, the traveling direction of the pulse laser beam 32, the focus position of the pulse laser beam 33, and the like. The various controls described above are merely examples, and other controls may be added as necessary.

2. EUV Light Generating Apparatus of Comparative Example

2.1 Configuration

Figure 2:
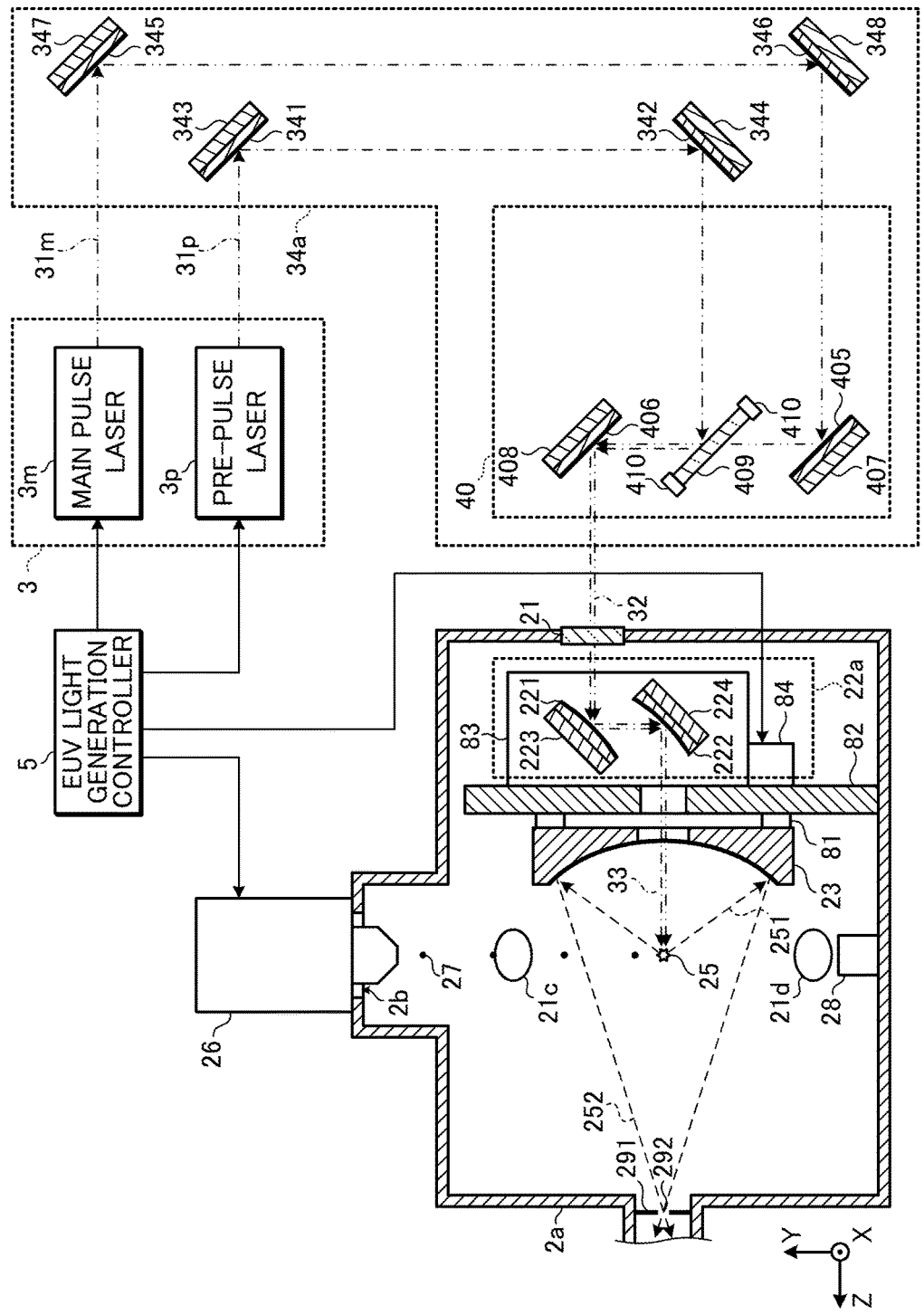
FIG. 2 schematically shows a configuration of an EUV light generating system according to a comparative example in the present disclosure.
Figure 3:
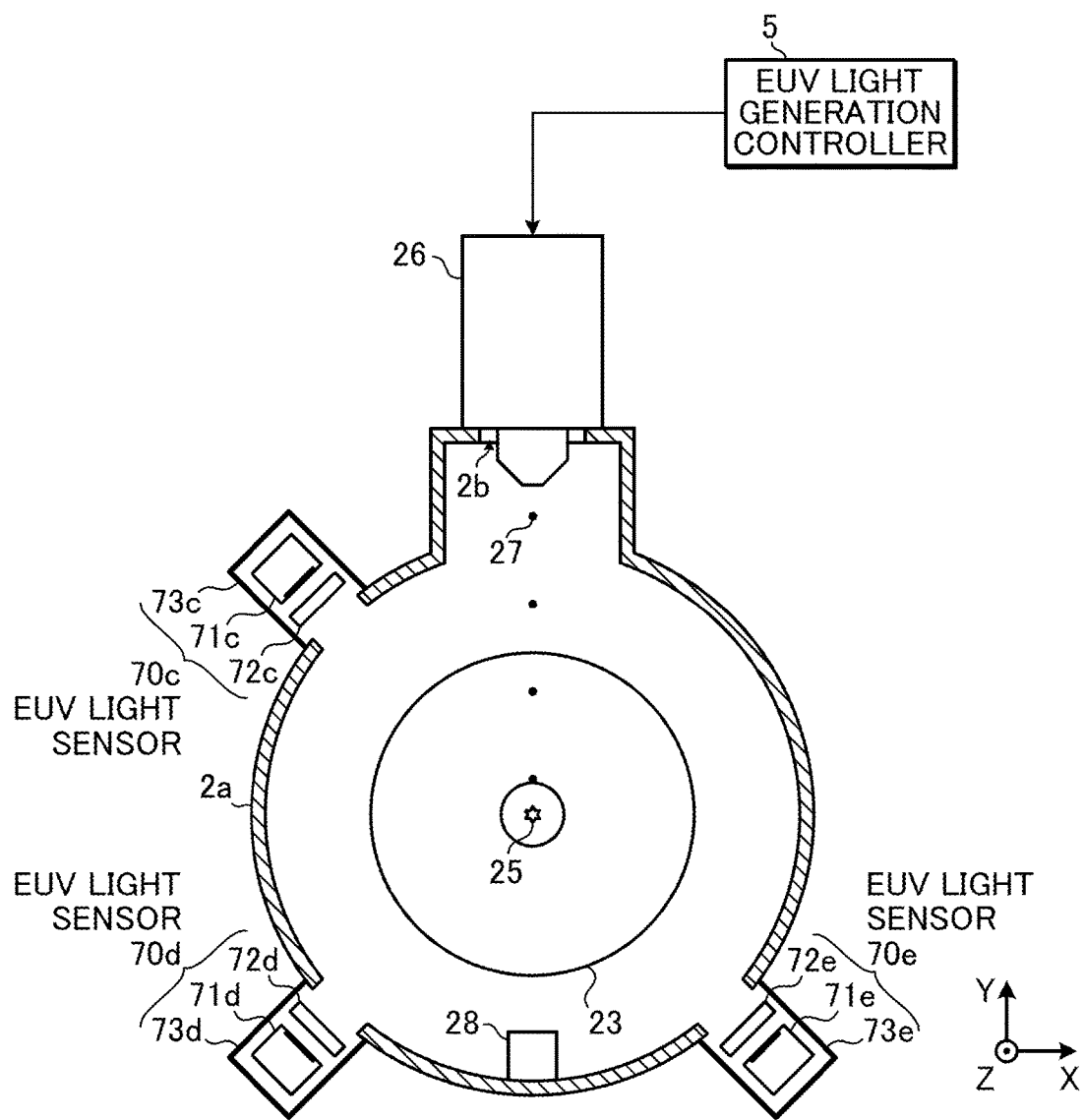
FIG. 3 schematically shows the configuration of the EUV light generating system according to the comparative example in the present disclosure.

FIGS. 2 and 3 schematically show a configuration of an EUV light generating system according to a comparative example in the present disclosure. As shown in FIGS. 2 and 3, an output direction of the EUV light may be a Z direction. A direction opposite to an output direction of the target may be a Y direction. The direction perpendicular to both of the Z direction and the I direction may be an X direction. FIG. 2 shows the EUV light generating system as viewed in the X direction. FIG. 3 shows the EUV light generating system as viewed in the -z direction. A definition of the coordinate system may not be limited to this. For example, the I direction may be inclined against the output direction of the target.

2.1.1 Target Supply Unit

The target supply unit 26 may be arranged to penetrate a wall of a chamber 2a via a through-hole 2b. An unillustrated sealer may be provided between the target supply unit 26 and a surrounding portion of the wall of the chamber 2a surrounding the through-hole 2b. This sealer may seal the gap between the target supply unit 26 and the surrounding portion surrounding the through-hole 2b.

The target supply unit 26 may store molten target material. The target material may be pressurized by inert gas supplied into the target supply unit 26. The target supply unit 26 may have an unillustrated opening at a position in the chamber 2a. An unillustrated vibrator may be attached to the target supply unit 26 in the vicinity of the opening. The target supply unit 26 may be configured to output the target 27 toward the plasma generation region 25 according to a control signal outputted from the EUV light generation controller 5.

2.1.2 Laser Apparatus

The laser apparatus 3 may include a pre-pulse laser 3p and a main pulse laser 3m. The pre-pulse laser 3p may output a pre-pulse laser beam 31p according to a control signal outputted from the EUV light generation controller 5. The main pulse laser 3m may output a main pulse laser beam 31m according to a control signal outputted from the EUV light generation controller 5. The wavelength of the main pulse laser beam 31m may be longer than that of the pre-pulse laser beam 31p. The energy of the main pulse laser beam 31m may be higher than that of the pre-pulse laser beam 31p. The pre-pulse laser beam 31p may correspond to a first pulse laser beam in the present disclosure. The main pulse laser beam 31m may correspond to a second pulse laser beam in the present disclosure.

2.1.3 Laser Beam Direction Control Unit

A laser beam direction control unit 34a provided outside the chamber 2a may include high-reflective mirrors 341 and 342. The high-reflective mirrors 341 and 342 may be provided in an optical path of the pre-pulse laser beam 31p outputted from the pre-pulse laser 3p. The high-reflective mirror 341 may be held by a holder 343. The high-reflective mirror 342 may be held by a holder 344. The high-reflective mirrors 341 and 342 may reflect the pre-pulse laser beam 31p in this order.

The laser beam direction control unit 34a may further include high-reflective mirrors 345 and 346. The high-reflective mirrors 345 and 346 may be provided in an optical path of the main pulse laser beam 31m outputted from the main pulse laser 3m. The high-reflective mirror 345 may be held by a holder 347. The high-reflective mirror 346 may be held by a holder 348. The high-reflective mirrors 345 and 346 may reflect the main pulse laser beam 31m in this order.

The laser beam direction control unit 34a may further include a beam combiner module 40. The beam combiner module 40 may include high-reflective mirrors 405 and 406, and a beam combiner 409. The high-reflective mirror 405 may be provided in an optical path of the main pulse laser beam 31m reflected by the high-reflective mirror 346. The high-reflective mirror 405 may be held by a holder 407. The high-reflective mirror 405 may reflect the main pulse laser beam 31m.

The beam combiner 409 may be provided in an intersecting position where the optical path of the pre-pulse laser beam 31p reflected by the high-reflective mirror 342 and the optical path of the main pulse laser beam 31m reflected by the high-reflective mirror 405 intersect with each other. The intersecting position of the optical paths may not be limited to a position where the central axis of the optical path of one laser beam intersects with that of the other laser beam. The intersecting position may be a position in an overlapping space where a part of the optical path of one laser beam having a certain beam width overlaps with that of the other laser beam. The beam combiner 409 may be held by a holder 410. The beam combiner 409 may cause the central axis of the optical path of the pre-pulse laser beam 31p and that of the main pulse laser beam 31m to substantially coincide with each other.

The high-reflective mirror 406 may be provided in the optical paths of the pre-pulse laser beam 31p and the main pulse laser beam 31m outputted from the beam combiner 409. The high-reflective mirror 406 may be held by a holder 408. The high-reflective mirror 406 may reflect the pre-pulse laser beam 31p and the main pulse laser beam 31m to the inside of the chamber 2a. In this specification, the pre-pulse laser beam 31p reflected by the high-reflective mirror 406 and the main pulse laser beam 31m reflected by the high-reflective mirror 406 may be collectively referred to as a pulse laser beam 32.

2.1.4 Laser Beam Focusing Optical System

A laser beam focusing optical system 22a, EUV collector mirror holders 81, and plates 82 and 83, and an actuator 84 for the laser beam focusing optical system are provided in the chamber 2.

The plate 82 may be fixed to the chamber 2a. The EUV collector mirror 23 may be fixed to the plate 82 via the EUV collector mirror holders 81. The plate 83 may be supported by the plate 82 via the actuator 84 for the laser beam focusing optical system. The laser beam focusing optical system 22a may include an off-axis paraboloidal convex mirror 221 and an ellipsoid concave mirror 222. The off-axis paraboloidal convex mirror 221 may be held by a holder 223. The ellipsoid concave mirror 222 may be held by a holder 224. The holders 223 and 224 may be fixed to the plate 83. The actuator 84 for the laser beam focusing optical system may be capable of changing the position of the plate 83 against the plate 82 according to a control signal outputted from the EUV light generation controller 5.

The off-axis paraboloidal convex mirror 221 may have a reflective convex surface of a paraboloid of revolution. The off-axis paraboloidal convex mirror 221 may be arranged such that the axis of the paraboloid of revolution is substantially parallel with the central axis of the optical path of the pulse laser beam 32 incident on the off-axis paraboloidal convex mirror 221.

The ellipsoid concave mirror 222 may have a reflective concave surface of a spheroidal shape. The ellipsoid concave mirror 222 may have a first focal point and a second focal point. The ellipsoid concave mirror 222 may be arranged such that the first focal point of the ellipsoid concave mirror 222 substantially coincides with the focal point of the off-axis paraboloidal convex mirror 221. The second focal point of the ellipsoid concave mirror 222 may be in the plasma generation region 25.

2.1.5 EUV Light Sensor

As shown in FIG. 3, EUV light sensors 70c to 70e may be mounted on the wall of the chamber 2a.

The EUV light sensors 70c to 70e may face the plasma generation region 25. The EUV light sensors 70c and 70d may be arranged at positions being mirror symmetric to each other with a virtual plane of symmetry parallel to the XZ plane. The virtual plane of symmetry parallel to the XZ plane may include the plasma generation region 25. The EUV light sensors 70d and 70e may be arranged at positions being mirror symmetric to each other with a virtual plane of symmetry parallel to the YZ plane. The virtual plane of symmetry parallel to the YZ plane may include the plasma generation region 25.

The EUV light sensor 70c may include an energy measuring unit 71c, an EUV light transmitting filter 72c, and a housing 73c. The energy measuring unit 71c and the EUV light transmitting filter 72c may be accommodated in the housing 73c. The EUV light sensors 70d and 70e may each have substantially the same constituent elements as the EUV light sensor 70c. However, the constituent elements of the EUV light sensor 70d may each be shown by a reference symbol including "d" at the last digit. The constituent elements of the EUV light sensor 70e may each be shown by a reference symbol including "e" at the last digit.

2.2 Operation 2.2.1 Outputting Target

The target material pressurized by the inert gas in the target supply unit 26 may be outputted via the opening. The vibrator may vibrate the target supply unit 26. This may cause the target material to be separated into a plurality of droplets. Each of the droplets may move as the target 27 along a trajectory from the target supply unit 26 to the plasma generation region 25.

2.2.2 Generating Plasma

The pre-pulse laser beam 31p outputted from the pre-pulse laser 3p and the main pulse laser beam 31m outputted from the main pulse laser 3m may travel via the laser beam direction control unit 34a and be directed to the laser beam focusing optical system 22a as the pulse laser beam 32.

The pulse laser beam 32 may be beam-expanded by being reflected by the off-axis paraboloidal convex mirror 221 included in the laser beam focusing optical system 22a. The pulse laser beam 32 reflected by the off-axis paraboloidal convex mirror 221 may be reflected by the ellipsoid concave mirror 222 and concentrated to the plasma generation region 25 as the pulse laser beam 33. The pulse laser beam 33 may include the pre-pulse laser beam 31p and the main pulse laser beam 31m.

At a point in time when one target 27 reaches the plasma generation region 25, the target 27 may be irradiated with the pre-pulse laser beam 31p. The target 27 irradiated with the pre-pulse laser beam 31p may expand or diffuse to turn into a secondary target. At a point in time when the secondary target expands or diffuses to a desired size, the secondary target may be irradiated with the main pulse laser beam 31m. The secondary target irradiated with the main pulse laser beam 31m may be turned into plasma. The plasma may emit the rays of light 251 including the EUV light.

2.2.3 Detecting EUV Mass Center

The EUV light sensors 70c to 70e may detect the energy of the EUV light emitted from the plasma and received by the respective EUV light sensors 70c to 70e. The EUV light generation controller 5 may calculate an EUV mass center based on energy values of the EUV light detected by the EUV light sensors 70c to 70e as described below.

A "mass center" of an object may mean, in classical mechanics, a point of application of the sum of gravity applied to the respective portions of the object. However, in this specification, an "EUV mass center" is a parameter indicating the position of the laser beam optical path or a piece of information used for controlling the position of the laser beam optical path. Specifically, the EUV mass center is a spatial position calculated from a plurality of detected values of electromagnetic wave detected by a plurality of sensors at positions different from each other. The electromagnetic wave may include light emitted from the plasma.

The energy values of the EUV light detected by the respective EUV light sensors 70c to 70e may be different from each other according to the distances from the EUV mass center to the respective EUV light sensors 70c to 70e. For example, let the energy values of the EUV light detected by the EUV light sensors 70c and 70d be E1 and E2, respectively. If the energy value E2 is higher than the energy value E1, it may be determined that the EUV light sensor 70d is closer to the EUV mass center than the EUV light sensor 70c is. The larger the difference between the energy values E1 and E2 is, the larger the difference between the distance from the EUV mass center to the EUV light sensor 70c and that to the EUV light sensor 70d is.

Accordingly, based on the difference between the energy values E1 and E2 of the EUV light detected by the EUV light sensors 70c and 70d, the EUV mass center in the Y direction may be calculated. Based on the difference between the energy values E2 and E3 of the EUV light detected by the EUV light sensors 70d and 70e, the EUV mass center in the X direction may be calculated. For example, the EUV mass center in the Y direction in the plasma may be calculated by a formula $(E1-E2)/(E1+E2)$. The EUV mass center in the X direction in the plasma may be calculated by a formula $(E2-E3)/(E2+E3)$.

2.3 Problem

Figure 4A:
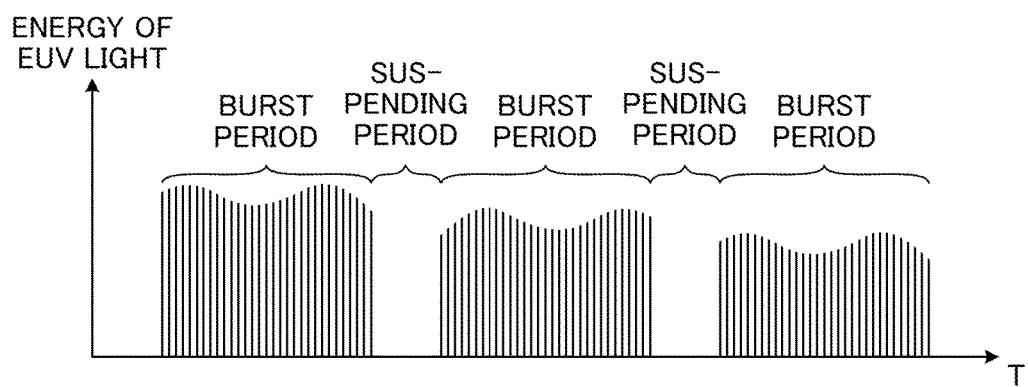
FIG. 4A shows time-dependent changes in the energy of EUV light in the case where an actuator 84 for a laser beam focusing optical system is not controlled in the EUV light generating system shown in FIGS. 2 and 3.
Figure 4B:
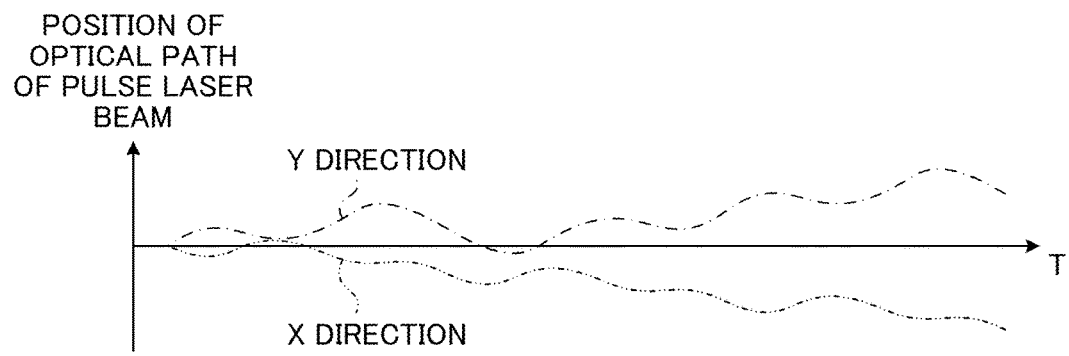
FIG. 4B shows time-dependent changes in the position of an optical path of a pulse laser beam in the vicinity of a plasma generation region 25 in the case shown in FIG. 4A.

FIG. 4A shows time-dependent changes in the energy of the EUV light in the case where the actuator 84 for the laser beam focusing optical system is not controlled in the EUV light generating system shown in FIGS. 2 and 3. FIG. 4B shows time-dependent changes in the position of the optical path of the pulse laser beam in the vicinity of the plasma generation region 25 in the case shown in FIG. 4A. The position of the optical path of the pulse laser beam in the vicinity of the plasma generation region 25 may be estimated based on the results of the calculation of the EUV mass center described above. The position of the optical path may be represented by a position of the optical path in the X direction and that in the Y direction.

As shown in FIG. 4A, the EUV light generating system may alternately repeat a burst period in which the EUV light is outputted at high repetition frequency based on the control signal from the exposure apparatus, and a suspending period in which output of the EUV light is suspended between two burst periods. A single burst period may correspond to a period to expose a single chip region of a semiconductor wafer including a plurality of chip regions. The suspending period may correspond to a period to move the semiconductor wafer from a position to expose one chip region to a position to expose another chip region by driving an unillustrated wafer stage. Alternatively, the suspending period may correspond to a period to replace the semiconductor wafer set on the wafer stage with another semiconductor wafer.

In an LPP type EUV light generating system shown in FIGS. 2 and 3, optical elements included in the laser beam direction control unit 34a, the laser beam focusing optical system 22a, or the like, may be heated by the energy of the pulse laser beam. Such optical elements may be deformed by heat to cause an optical path of the pulse laser beam to change. As shown in FIG. 4B, if the actuator 84 for the laser beam focusing optical system is not controlled, the position of the optical path of the pulse laser beam in the vicinity of the plasma generation region 25 may change to gradually go away from the original position. Such change in the position of the optical path may cause the position of the portion of the target 27 irradiated with the pulse laser beam to change. The position where the plasma is generated may thus change and the EUV mass center may also change.

Changes in the position of the optical path of the pulse laser beam in the vicinity of the plasma generation region 25 may cause the irradiating condition of the target 27 to fail to be an optimum irradiating condition and cause the energy of the EUV light to be reduced as shown in FIG. 4A. Significant changes in the position of the optical path may cause the target 27 to fail to be irradiated with the pulse laser beam and cause the EUV light to fail to be generated. Accordingly, it is preferable to adjust the position of the optical path of the pulse laser beam to an optimum position on the target 27. In the comparative example shown in FIGS. 2 and 3, the position of the optical path of the pulse laser beam may be adjusted by controlling the actuator 84 for the laser beam focusing optical system to stabilize the EUV mass center based on the detected EUV mass center.

Figure 5A:
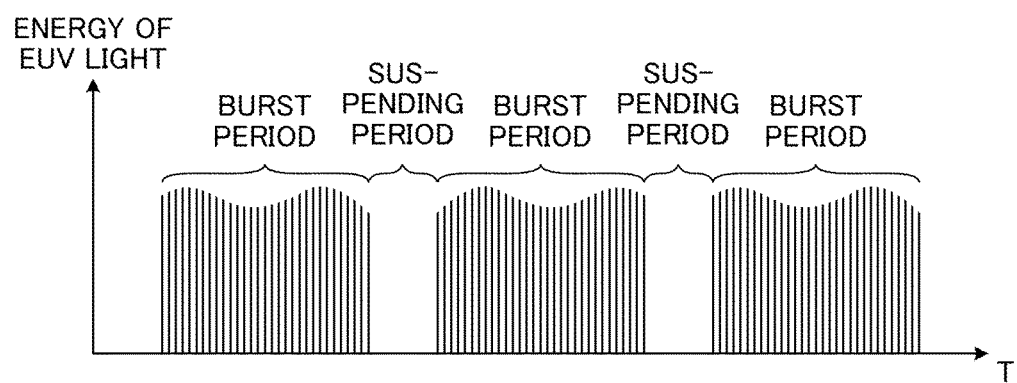
FIG. 5A shows time-dependent changes in the energy of the EUV light in the case where the actuator 84 for the laser beam focusing optical system is controlled in the EUV light generating system shown in FIGS. 2 and 3.
Figure 5B:
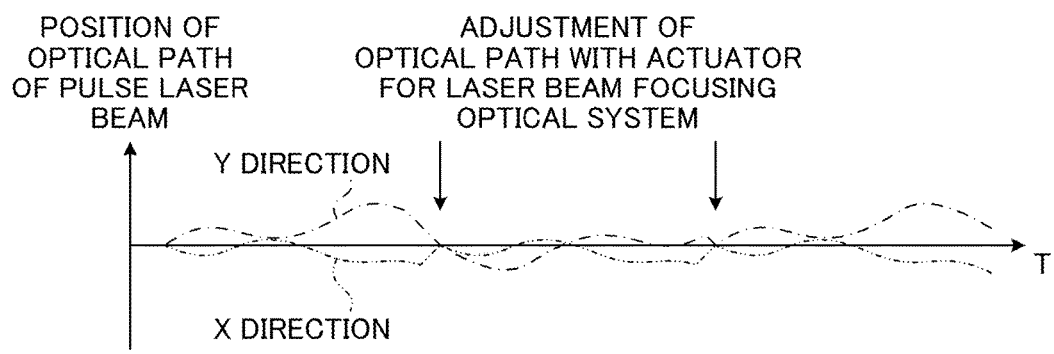
FIG. 5B shows time-dependent changes in the position of the optical path of the pulse laser beam in the vicinity of the plasma generation region 25 in the case shown in FIG. 5A.

FIG. 5A shows time-dependent changes in the energy of the EUV light in the case where the actuator 84 for the laser beam focusing optical system is controlled in the EUV light generating system shown in FIGS. 2 and 3. FIG. 5B shows time-dependent changes in the position of the optical path of the pulse laser beam in the vicinity of the plasma generation region 25 in the case shown in FIG. 5A.

As shown in FIG. 5B, the actuator 84 for the laser beam focusing optical system may be controlled, for example, in each suspending period. This may allow the energy of the EUV light to be stabilized for a long time even if the combination of the burst period and the suspending period is repeated for multiple times.

However, in the comparative example, the actuator 84 for the laser beam focusing optical system may move the plate 83 with the optical elements included in the laser beam focusing optical system 22a fixed to the plate 83. The optical elements included in the laser beam focusing optical system 22a may have a large weight by being accompanied by a cooling unit to suppress thermal deformation or accompanied by at least a part of the cooling unit including a coolant flow channel. Accordingly, it may be difficult to rapidly change the optical path of the pulse laser beam by the actuator 84 for the laser beam focusing optical system. Especially, a speed to change the position of the optical path caused by heat in the burst period may be much higher than a speed to change the position of the optical path by the actuator 84 for the laser beam focusing optical system. For example, a resonance frequency of the plate 83 and the optical elements integrally driven by the actuator 84 may be around 10 Hz. In this case, a response time of the actuator 84 may be around 100 ms. In contrast, the position of the optical path in the burst period may be changed within several milliseconds.

Even if the optical path of the pulse laser beam is controlled in each suspending period as shown in. FIG. 5B, the position of the optical path of the pulse laser beam may change in each burst period. It may thus be difficult, as shown in FIG. 5A, to stabilize the energy of the EUV light in each burst period. Here, description is made in the case where the optical path of the pulse laser beam is controlled in each suspending period. However, even if the optical path of the pulse laser beam is controlled in the burst periods, it may similarly be difficult to rapidly change the optical path of the pulse laser beam and thus substantially the same problem may arise.

In the embodiments described below, a high-reflective mirror with a high-speed actuator may be provided in the optical path of the pre-pulse laser beam. The high-speed actuator may be controlled based on the detected EUV mass center.

3. Beam Combiner Module Capable of Adjusting Optical Path 3.1 Configuration

Figure 6:
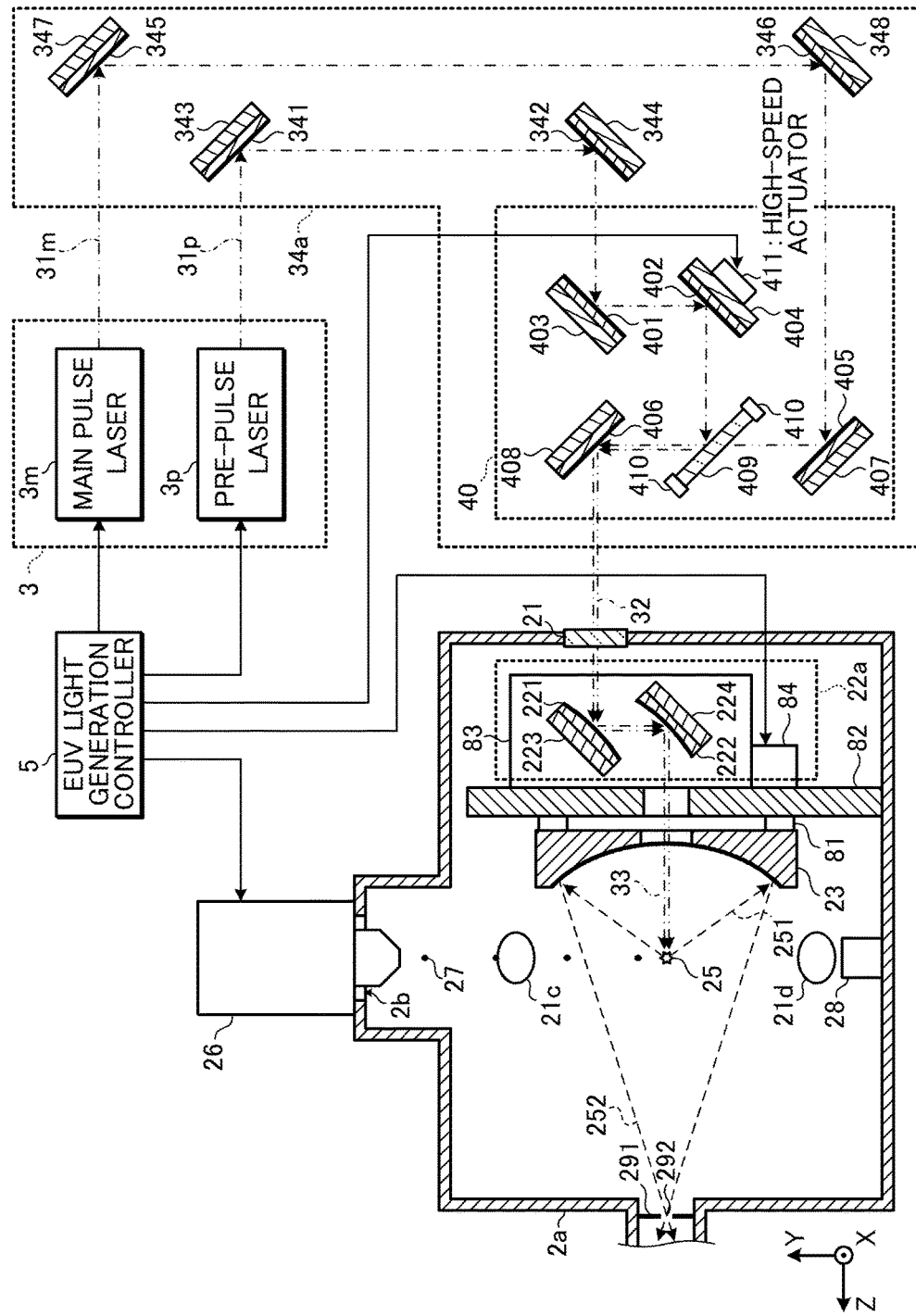
FIG. 6 schematically shows a configuration of an EUV light generating system according to a first embodiment of the present disclosure.

FIG. 6 schematically shows a configuration of an EUV light generating system according to a first embodiment of the present disclosure. In the first embodiment, high-reflective mirrors 401 and 402 may be provided in an optical path of the pre-pulse laser beam 31p at a position before being combined with the optical path of the main pulse laser beam 31m by the beam combiner 409. The high-reflective mirror 401 may be held by a holder 403. The high-reflective mirror 402 may be held by a holder 404.

The high-reflective mirror 402 and the holder 404 may be capable of changing its posture by a high-speed actuator 411. Controlling the high-speed actuator 411 may achieve adjustment of the position of the optical path of the pre-pulse laser beam 31p in the vicinity of the plasma generation region 25. The high-speed actuator 411 may be controlled by the EUV light generation controller 5. The high-speed actuator 411 may correspond to a first actuator in the present disclosure. The actuator 84 for the laser beam focusing optical system may correspond to a second actuator in the present disclosure.

In the other aspects, the configuration of the first embodiment may be substantially the same as that of the comparative example described with reference to FIGS. 2 and 3.

3.2 Operation and Function

The spot diameter of the pre-pulse laser beam 31p concentrated by the laser beam focusing optical system 22a may be smaller than the spot diameter of the main pulse laser beam 31m concentrated by the laser beam focusing optical system 22a. Accordingly, improving accuracy in the position of the optical path of the pre-pulse laser beam 31p in the vicinity of the plasma generation region 25 may highly contribute to stability of the energy of the EUV light, rather than improving accuracy in the position of the optical path of the main pulse laser beam 31m in the vicinity of the plasma generation region 25.

The energy of the pre-pulse laser beam 31p may be smaller than the energy of the main pulse laser beam 31m. Accordingly, a cooling unit may not be necessary for the high-reflective mirror 402 or the holder 404 provided in the optical path of the pre-pulse laser beam 31p. This may reduce the weight of the high-reflective mirror 402 and the holder 404 to improve the resonance frequency. Thus, the response speed of the high-speed actuator 411 may be improved. The resonance frequency of the high-reflective mirror 402 and the holder 404 with the high-speed actuator 411 may be, for example, around 1 kHz. In this case, a response time of the high-speed actuator 411 may be 0.5 ms or more, 10 ms or less. Preferably, it may be 1 ms or more, 3 ms or less.

The response speed of the actuator 84 for the laser beam focusing optical system may be slower than that of the high-speed actuator 411. In contrast, the range of adjustment of the optical path with the actuator 84 for the laser beam focusing optical system may be larger than that with the high-speed actuator 411. Accordingly, high-speed adjustment of the position of the optical path of the pre-pulse laser beam 31$p$ in the vicinity of the plasma generation region 25 may be achieved by the high-speed actuator 411 and low-speed adjustment may be made by the actuator 84 for the laser beam focusing optical system. Adjustment of the position of the optical path of the pre-pulse laser beam 31$p$ in the vicinity of the plasma generation region 25 may thus be made in a range wider than the range of adjustment of the optical path with the high-speed actuator 411. Such process is described below with reference to a flowchart shown in FIG. 7.

Figure 7:
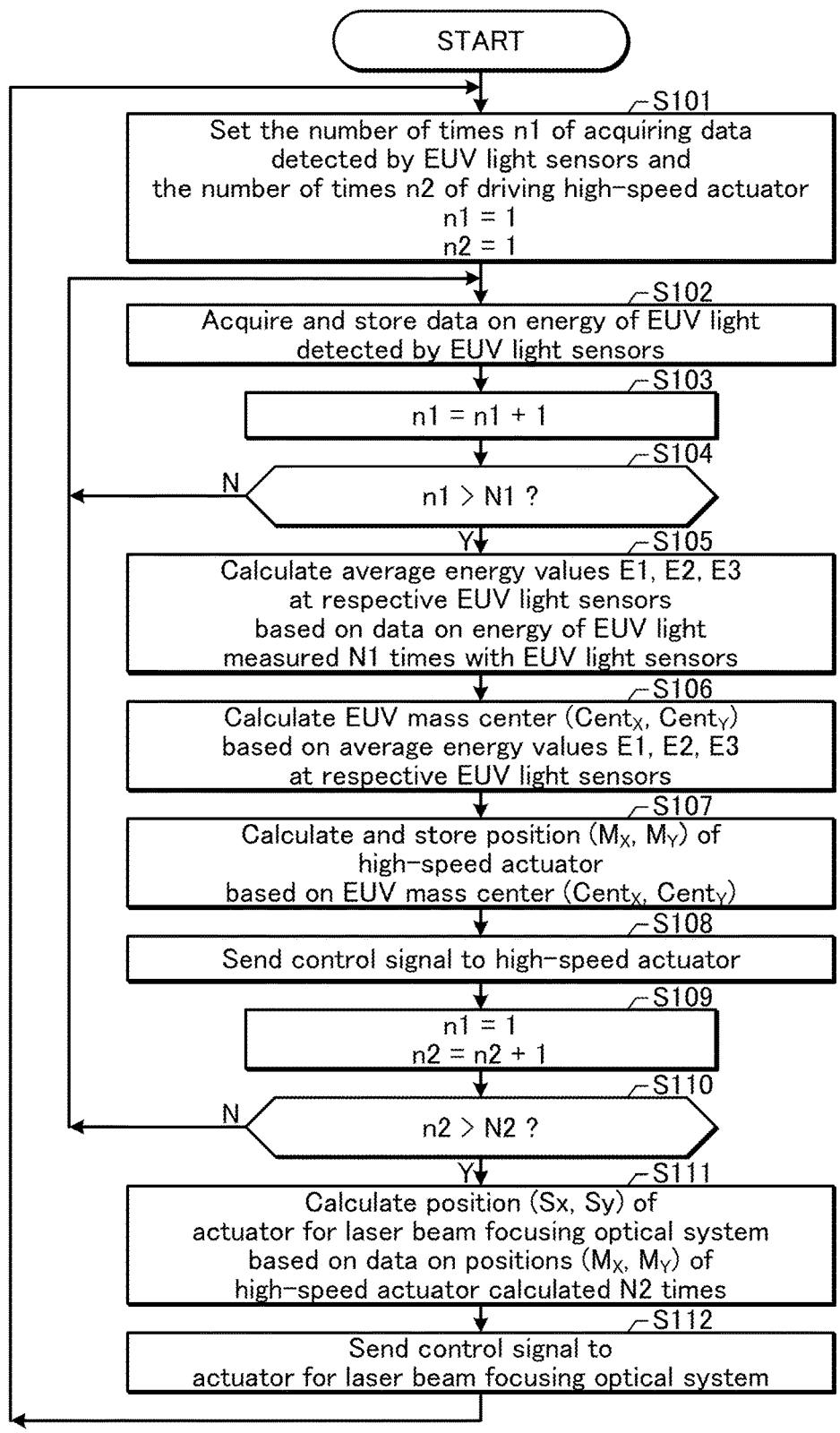
FIG. 7 is a flowchart showing a process of adjustment of an optical path performed by an EUV light generation controller 5 shown in FIG. 6.

FIG. 7 is a flowchart showing a process of adjustment of the optical path performed by the EUV light generation controller 5 shown in FIG. 6. The EUV light generation controller 5 may control both the high-speed actuator 411 and the actuator 84 for the laser beam focusing optical system in the process described below.

First, at S101, the EUV light generation controller 5 may perform an initial setting of several parameters. For example, the EUV light generation controller 5 may set the number of times n1 of acquiring data detected by the EUV light sensors 70$c$ to 70$e$ to 1. The EUV light generation controller 5 may further set the number of times n2 of driving the high-speed actuator 411 to 1.

Next, at S102, the EUV light generation controller 5 may acquire the data on the energy detected by the EUV light sensors 70$c$ to 70$e$. The EUV light generation controller 5 may store the data on the energy detected by the EUV light sensors 70$c$ to 70$e$ in a storage device in association with the number of times n1 of acquiring data. The storage device may be a memory 1002 described below.

Next, at S103, the EUV light generation controller 5 may add 1 to the number of times n1 of acquiring data to update n1.

Next, at S104, the EUV light generation controller 5 may determine whether the number of times n1 of acquiring data is over a predetermined value N1. The predetermined value N1 may be the number of times of acquiring data on the energy for calculating average energy values of the EUV light. If the number of times n1 of acquiring data is not over the predetermined value N1 (S104: NO), the EUV light generation controller 5 may return to S102 to repeat the process such as acquiring the data on the energy. If the number of times n1 of acquiring data is over the predetermined value N1 (S104: YES), the EUV light generation controller 5 may proceed to S105.

At S105, the EUV light generation controller 5 may calculate the average energy values E1, E2, and E3 at the respective EUV light sensors 70$c$, 70$d$, and 70$e$. This calculation may be made based on the data on the energy measured N1 times with each of the EUV light sensors 70$c$, 70$d$, and 70$e$.

Next, at S106, the EUV light generation controller 5 may calculate the EUV mass center based on the average energy values E1, E2, and E3. The EUV mass center may be described by a combination of a value $\text{Cent}_X$ representing the EUV mass center in the X direction and a value $\text{Cent}_Y$ representing the EUV mass center in the Y direction. The values $\text{Cent}_X$ and $\text{Cent}_Y$ representing the EUV mass center may be calculated as follows $$\text{Cent}_X = (E2 - E3)/(E2 + E3)$$

$$\text{Cent}_Y = (E1 - E2)/(E1 + E2)$$

Next, at S107, the EUV light generation controller 5 may calculate setting values of the control signal to be given to the high-speed actuator 411. The setting values may be calculated based on the values $\text{Cent}_X$ and $\text{Cent}_Y$ representing the EUV mass center, and target values $\text{Cent}_{targetX}$ and $\text{Cent}_{targetY}$ of the EUV mass center. The setting values of the control signal to be given to the high-speed actuator 411 may include a setting value $SV_X$ in the X direction and a setting value $SV_Y$ in the Y direction. The setting value $SV_X$ in the X direction may be calculated as follows.

$$\Delta_X = \text{Cent}_{targetX} - \text{Cent}_X$$

$$SV_X = Kp_X \times \Delta_X + Ki_X \times I_X(\Delta_X)$$

Here, $\Delta_X$ may be a difference between the target value $\text{Cent}_{targetX}$ of the EUV mass center and the value $\text{Cent}_X$ representing the EUV mass center. The setting value $SV_X$ may be a setting value to be inputted to a controlled object in a PI control. The setting value $SV_X$ may be obtained by adding a product of a proportional gain $Kp_X$ and the difference $\Delta_X$ to a product of an integral gain $Ki_X$ and an integral term $I_X(\Delta_X)$.

The setting value $SV_Y$ in the Y direction may be calculated as follows, similarly to the calculation of the setting value $SV_X$ in the X direction. However, the subscript X may be substituted by a subscript Y.

$$\Delta_Y = \text{Cent}_{targetY} - \text{Cent}_Y$$

$$SV_Y = Kp_Y \times \Delta_Y + Ki_Y \times I_Y(\Delta_Y)$$

Further, the EUV light generation controller 5 may calculate a position of the high-speed actuator 411 based on the setting values $SV_X$ and $SV_Y$ of the control signal to be given to the high-speed actuator 411. The position of the high-speed actuator 411 may be represented by a combination of a position $M_X$ in the X direction and a position $M_Y$ in the Y direction. $M_X$ and $M_Y$ representing the position of the high-speed actuator 411 may be calculated as follows.

$$M_X = M_X + SV_X \times \alpha_X$$

$$M_Y = M_Y + SV_Y \times \alpha_X$$

Here, $\alpha_X$ and $\alpha_Y$ may each be a parameter according to the characteristics of the high-speed actuator 411.

The EUV light generation controller 5 may store $M_X$ and $M_Y$ representing the position of the high-speed actuator 411 in the storage device in association with the number of times n2 of driving the high-speed actuator 411. The storage device may be the memory 1002 described below.

Next, at S108, the EUV light generation controller 5 may send the control signal using the setting values, $SV_X$ and $SV_Y$ to the high-speed actuator 411.

Next, at S109, the EUV light generation controller 5 may reset the number of times n1 of acquiring data to 1. Further, the EUV light generation controller 5 may add 1 to the number of times n2 of driving the high-speed actuator 411 to update n2.

Next, at S110, the EUV light generation controller 5 may determine whether the number of times n2 of driving the high-speed actuator 411 is over a predetermined value N2. The predetermined value N2 may be the number of times of driving the high-speed actuator 411 for calculating average position of the high-speed actuator 411. If the number of times n2 of driving the high-speed actuator 411 is not over the predetermined value N2 (S110: NO), the EUV light generation controller 5 may return to S102 to repeat the process such as acquiring data on the energy and driving the high-speed actuator 411. if the number of times n2 of driving the high-speed actuator 411 is over the predetermined value N2 (S110: YES), the EUV light generation controller 5 may proceed to S111.

At S111, the EUV light generation controller 5 may calculate setting values of the control signal to be given to the actuator 84 for the laser beam focusing optical system. As described below, the setting values of the control signal to be given to the actuator 84 may not necessarily be calculated based directly on the EUV mass center. The setting values of the control signal to be given to the actuator 84 may be calculated based on values related to control of the high-speed actuator 411.

The setting values of the control signal to be given to the actuator 84 for the laser beam focusing optical system may be calculated based on a central position of the movable range of the high-speed actuator 411, which is represented by $S_{targetX}$ and $S_{targetY}$, and the positions of the high-speed actuator 411 calculated N2 times at S107, each of which is represented by $M_X$ and $M_Y$. The setting values of the control signal to be given to the actuator 84 may include a setting value $sv_x$ in the X direction and a setting value $sv_y$ in the Y direction. The setting value $sv_x$ in the X direction may be calculated as follows.

$$\Delta_x = S_{targetX} - \text{Avg}(M_X)$$

$$sv_x = kp_x \times \Delta_x + ki_x \times i_x(\Delta_x)$$

Here, $\Delta_x$ may be a difference between the central position $S_{targetX}$ of the movable range of the high-speed actuator 411 and the average position $\text{Avg}(M_X)$ of the positions of the high-speed actuator 411 calculated N2 times. The setting value $sv_x$ may be a setting value to be inputted to a controlled object in a P1 control. The setting value $sv_x$ may be obtained by adding a product of a proportional gain $kp_x$ and the difference $\Delta_x$ to a product of an integral gain $ki_x$ and an integral term $i_x (\Delta_x)$.

Calculation of the setting value $sv_x$ of the control signal as described above may cause the difference $\Delta_x$ between the central position $S_{targetX}$ of the movable range of the high-speed actuator 411 and the average position $\text{Avg}(M_X)$ of the positions of the high-speed actuator 411 calculated N2 times to approach 0.

Similarly to the setting value $sv_x$ in the X direction, the setting value $sv_y$ in the Y direction may be calculated as follows.

However, the subscript x may be substituted by a subscript y.

$$\Delta_y = S_{targetY} - \text{Avg}(M_Y)$$

$$sv_y = kp_y \times \Delta_y + ki_y \times i_y(\Delta_y)$$

The EUV light generation controller 5 may further calculate the position of the actuator 84 for the laser beam focusing optical system based on the setting values $sv_x$ and $sv_y$ of the control signal to be given to the actuator 84. The position of the actuator 84 may be represented by a combination of a position $S_x$ in the X direction and a position $S_y$ in the Y direction. $S_x$ and $S_y$ representing the position of the actuator 84 may be calculated as follows.

$$S_x = S_x + sv_x \times \alpha_x$$

$$S_y = S_y + sv_y \times \alpha_y$$

Here, $\alpha_x$ and $\alpha_y$ may each be a parameter according to the characteristics of the actuator 84 for the laser beam focusing optical system.

Next, at S112, the EUV light generation controller 5 may send the control signal using the setting values $sv_x$ and $sv_y$ to the actuator 84 for the laser beam focusing optical system. Sending the control signal to the actuator 84 may cause the start of driving the actuator 84. The actuator 84 may be driven at a lower speed than the high-speed actuator 411.

After S112, the EUV light generation controller 5 may return to S101. Thus, the EUV light generation controller 5 may reset the number of times n2 of driving the high-speed actuator 411 to the initial value 1 and repeat the process described above. During the period after sending the control signal at S112 to the actuator 84 for the laser beam focusing optical system but before ending of driving the actuator 84, the high-speed actuator 411 may be controlled based on newly measured energy values of the EUV light. Accordingly, driving the actuator 84 for the laser beam focusing optical system does not result in a significant shift of the EUV mass center from the target values $\text{Cent}_{targetX}$ and $\text{Cent}_{targetY}$.

3.3 Effect

Figure 8:
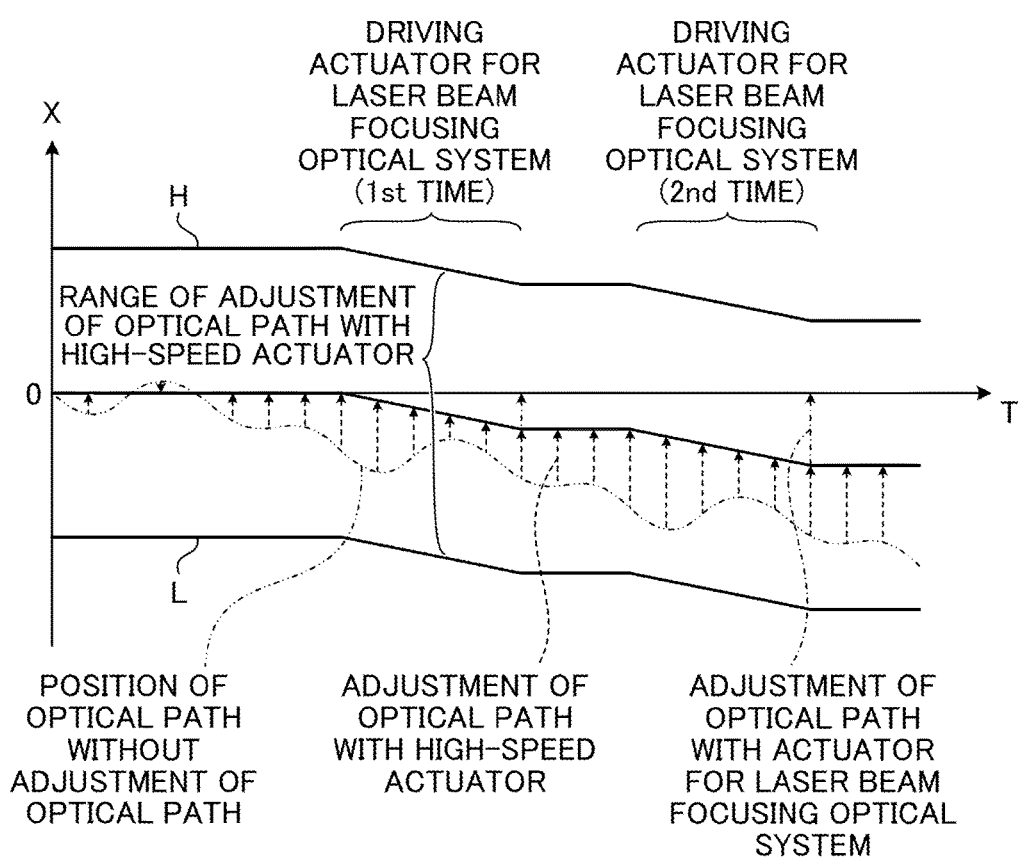
FIG. 8 shows time-dependent changes in the position of the optical path of a pre-pulse laser beam 31*p* in the vicinity of the plasma generation region 25 in the case where the adjustment of the optical path is not performed in the first embodiment.

FIG. 8 shows time-dependent changes in the position of the optical path of the pre-pulse laser beam 31p in the vicinity of the plasma generation region 25 in the case where the adjustment of the optical path is not performed in the first embodiment. FIG. 8 further shows time-dependent changes in the position of the optical path adjusted by the high-speed actuator 411 and the actuator 84 for the laser beam focusing optical system. FIG. 8 further shows time-dependent changes in the range of adjustment of the optical path with the high-speed actuator 411. FIG. 8 exemplary shows the position of the optical path in the X direction and the adjustment of the optical path in the X direction. The position of the optical path in the X direction is represented by a position of the optical path relative to the target position of the EUV mass center in the X direction. The position of the optical path may be 0 at the target position of the EUV mass center.

Let the position of the optical path of the pre-pulse laser beam 31p in the vicinity of the plasma generation region 25 at the time T=0 in the case where the adjustment of the optical path is not performed in FIG. 8 be 0. During EUV light generation, optical elements may be heated and thus the position of the optical path may fluctuate with time. Accordingly, the adjustment of the optical path with the high-speed actuator 411 may be performed every N1 times of acquiring the data on the energy of the EUV light. The adjustment of the optical path with the high-speed actuator 411 is shown by arrows with broken lines. The arrows with broken lines may show the timing of adjustment of the optical path with the high-speed actuator 411. The adjustment of the optical path with the high-speed actuator 411 may be performed at high frequency and high accuracy in response to the fluctuation in the position of the optical path. However, the range of adjustment of the optical path with the high-speed actuator 411 may be relatively small. The high-speed actuator 411 may be capable of adjusting the optical path only in a range between a polygonal line L and a polygonal line H in FIG. 8.

Further, the adjustment of the optical path with the actuator 84 for the laser beam focusing optical system may be performed every N2 times of driving the high-speed actuator 411. The adjustment of the optical path with the actuator 84 may be shown by arrows with dot and dash lines. The arrows with dot and dash lines may show the timing of adjustment of the optical path with the actuator 84. The adjustment of the optical path with the actuator 84 may be performed at a low frequency and a low speed. Thus, the high-speed actuator 411 may be driven more than once while the actuator 84 is driven once. If the adjustment of the optical path is performed with the actuator 84, the amount of driving the actuator 84 may be subtracted from the amount of driving the high-speed actuator 411 to perform the adjustment of the optical path with the high-speed actuator 411. The amount of driving the high-speed actuator 411 may thus be small. If the adjustment of the optical path is performed with the actuator 84, the range of adjustment of the optical path with the high-speed actuator 411 shown by the polygonal lines L and H may shift. The target position of the EUV mass center may be kept in the range of adjustment of the optical path with the high-speed actuator 411. Even if the adjustment of the optical path with the high-speed actuator 411 is limited in a small range, combining it with the adjustment of the optical path with the actuator 84 may achieve adjustment of the optical path in a wide range.

Figure 9A:
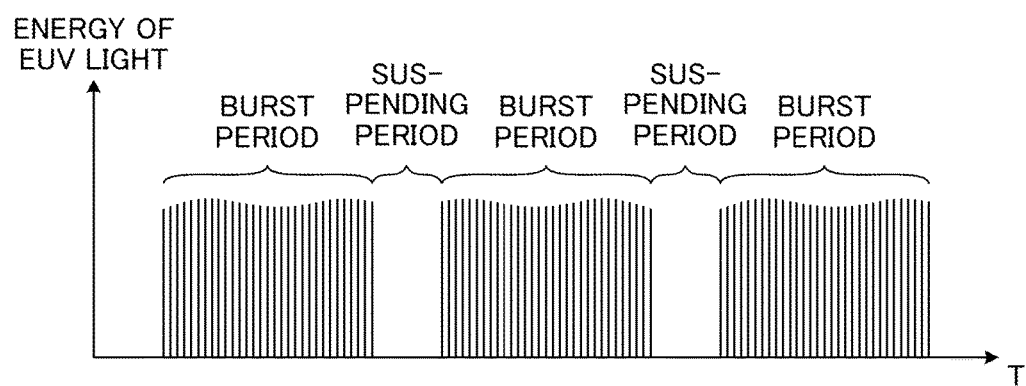
FIG. 9A shows time-dependent changes in the energy of the EUV light in the case where the high-speed actuator 411 and the actuator 84 for the laser beam focusing optical system are both controlled in the EUV light generating system shown in FIG. 6.
Figure 9B:
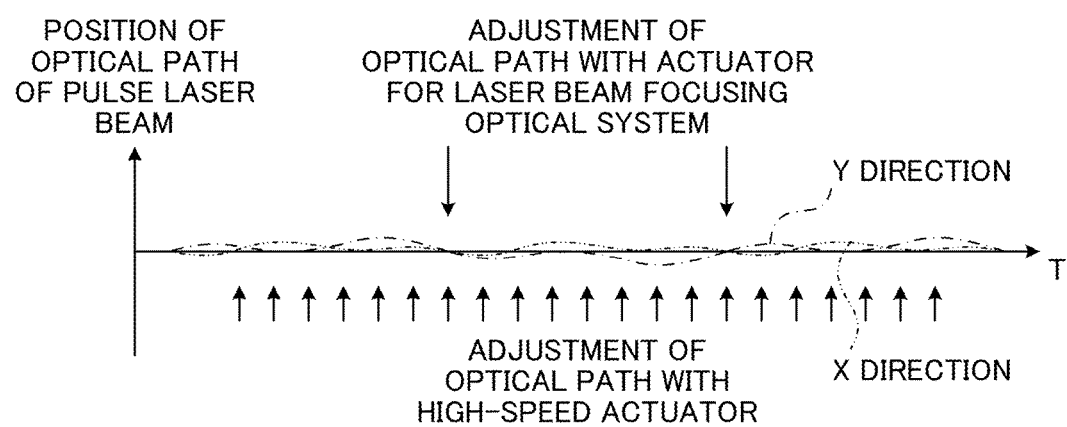
FIG. 9B shows time-dependent changes in the position of the optical path of the pulse laser beam in the vicinity of the plasma generation region 25 in the case shown in FIG. 9A.

FIG. 9A shows time-dependent changes in energy of the EUV light in the case where the high-speed actuator 411 and the actuator 84 for the laser beam focusing optical system are both controlled in the EUV light generating system shown in FIG. 6. FIG. 9B shows time-dependent changes in the position of the optical path of the pre-pulse laser beam 31$p$ in the vicinity of the plasma generation region 25 in the case shown in FIG. 9A.

As described above with reference to FIGS. 5A and 5B, it is difficult in the comparative example to stabilize the energy of the EUV light in the burst period. In contrast, as shown in FIGS. 9A and 9B, it may be possible in the first embodiment to stabilize the position of the optical path of the pre-pulse laser beam 31$p$ and the energy of the EUV light. Control of the actuator 84 for the laser beam focusing optical system may be possible in the burst period as well as in the suspending period.

In the above description, the target 27 is irradiated with one pulse of the pre-pulse laser beam and one pulse of the main pulse laser beam. However, the present disclosure is not limited to this. The target 27 may be irradiated with two or more pulses of the pre-pulse laser beam and one pulse of the main pulse laser beam. In this case, for example, the high-speed actuator to be controlled in substantially the same manner as that described above may be provided in the optical path of a first pre-pulse laser beam. This may achieve substantially the same effects as those described above. Irradiating the target 27 with two pulses of the pre-pulse laser beam and one pulse of the main pulse laser beam is described below with reference to FIGS. 13 and 14.

4. Beam Combiner Module Including Plurality of Actuators

Figure 10:
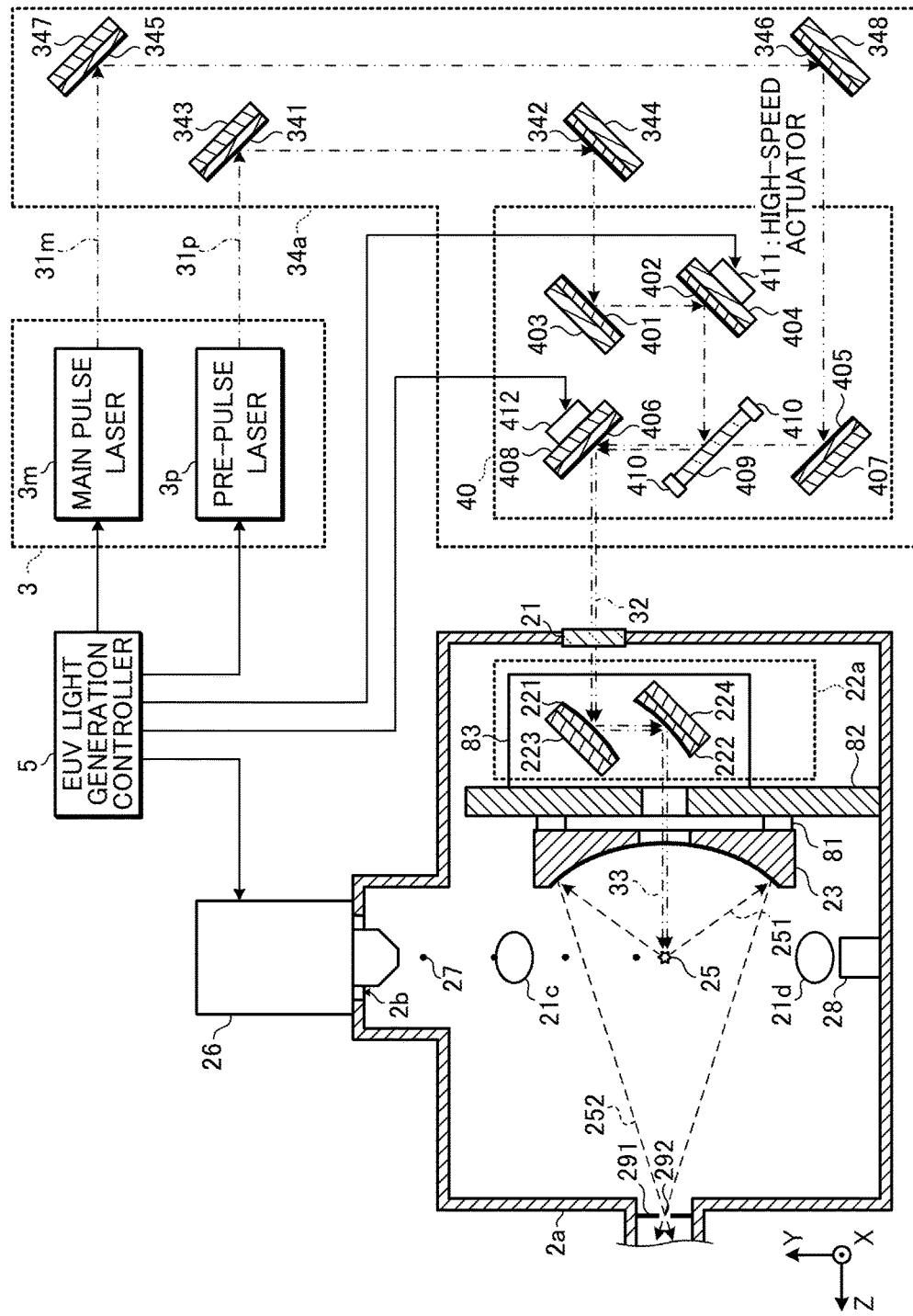
FIG. 10 schematically shows a configuration of an EUV light generating system according to a second embodiment of the present disclosure.

FIG. 10 schematically shows a configuration of an UV light generating system according to a second embodiment of the present disclosure. In the second embodiment, the high-reflective mirror 406 and the holder 408 provided in the optical paths of the main pulse laser beam 31$m$ and the pre-pulse laser beam 31$p$ after being combined by the beam combiner 409 ray be capable of changing their postures by an actuator 412 for the mirror. Controlling the actuator 412 for the mirror may achieve adjusting the position of the optical path of the main pulse laser beam 31$m$ and that of the pre-pulse laser beam 31$p$ in the vicinity of the plasma generation region 25. The actuator 412 for the mirror may be controlled by the EUV light generation controller 5. The actuator 412 for the mirror may correspond to a second actuator of the present disclosure. The actuator 84 for the laser beam focusing optical system in the first embodiment, which may also correspond to the second actuator, may not necessarily be provided in the second embodiment.

In other aspects, the second embodiment may have substantially the same configuration as the first embodiment described above with reference to FIG. 6.

Control of the actuator 412 for the mirror in the second embodiment may be substantially the same as that of the actuator 84 for the laser beam focusing optical system in the first embodiment.

Effects of the second embodiment may be substantially the same as those of the first embodiment described above.

Figure 11:
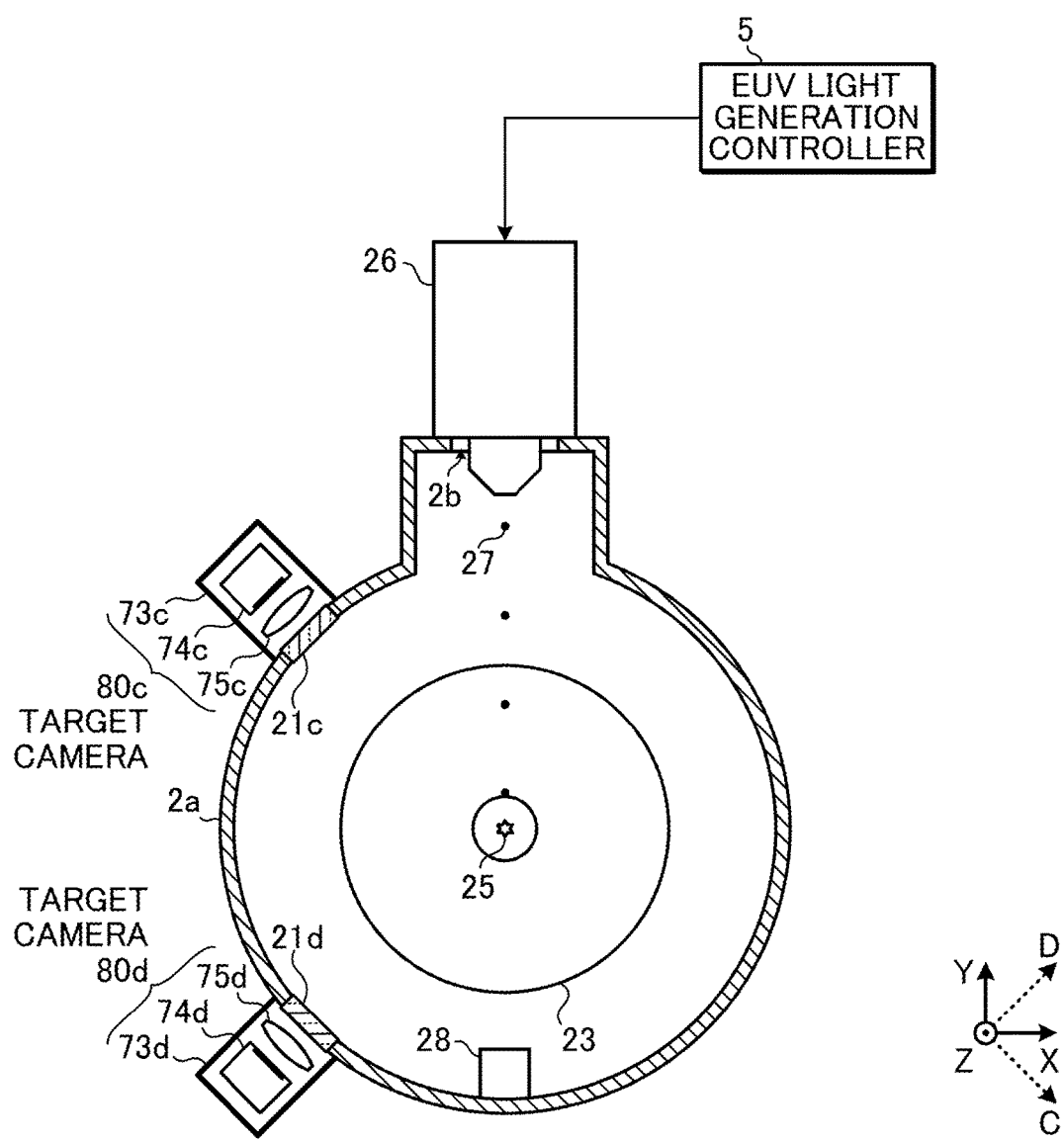
FIG. 11 schematically shows a configuration of an EUV light generating system according to a third embodiment of the present disclosure.

5. EUV Light Generating Apparatus Including Plurality of Target Cameras 5.1 Configuration FIG. 11 schematically shows a configuration of an EUV light generating system according to a third embodiment of the present disclosure. The third embodiment may include target cameras 80$c$ and 80$d$. The target cameras 80$c$ and 80$d$ may be provided at the positions equivalent to the positions of the EUV light sensors 70$c$ and 70$d$, respectively, described above with reference to FIG. 3. The wall of the chamber 2$a$ may have windows 21$c$ and 21$d$ at positions corresponding to the respective positions on which the target cameras 80$c$ and 80$d$ are mounted. The target camera 80$c$ may include an image sensor 74$c$, a transfer optical system 75$c$, and a housing 73$c$. The image sensor 74$c$ and the transfer optical system 75$c$ may be accommodated in the housing 73$c$. An unillustrated high-speed shutter may also be accommodated in the housing 73$c$. Constituent elements of the target camera 80$d$ may be substantially the same as those of the target camera 80$c$. However, the constituent elements of the target camera 80$d$ may each be shown by a reference symbol including "d" at the last digit.

An unillustrated light source may be provided in the chamber 2$a$ to photograph the target. The EUV light sensors 70$c$ to 70$e$ in the first embodiment may be omitted in the third embodiment.

In addition to the X, Y, and Z directions, C and D directions perpendicular to each other in the XY plane may be defined in FIG. 11. The C direction may correspond to a direction of the target camera 80$c$ to photograph the target. The D direction may correspond to a direction of the target camera 80$d$ to photograph the target.

5.2 Operation

The target cameras 80$c$ and 80$d$ may photograph the target immediately after being irradiated with the pre-pulse laser beam 31$p$. The EUV light generation controller 5 may calculate the position of the optical path of the pre-pulse laser beam 31$p$ in the vicinity of the plasma generation region 25. Such calculation may be based on the image of the target immediately after being irradiated with the pre-pulse laser beam 31$p$ and before being irradiated with the main pulse laser beam 31$m$. Alternatively, the target cameras 80$c$ and 80$d$ may photograph the plasma generated by irradiating the target 27 with the pre-pulse laser beam 31$p$ and the main pulse laser beam 31$m$. The EUV light generation controller 5 may calculate the EUV mass center based on the image of the plasma.

Figure 12A:
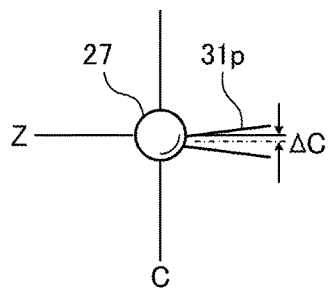
FIGS. 12A to 12I describe a principle for calculating the position of the optical path of the pre-pulse laser beam in the vicinity of the plasma generation region 25 based on an image of a target immediately after being irradiated with the pre-pulse laser beam.
Figure 12D:
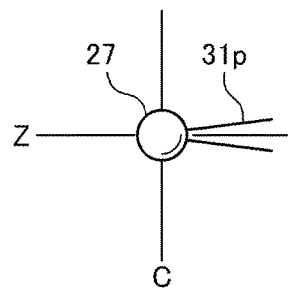
Figure 12G:
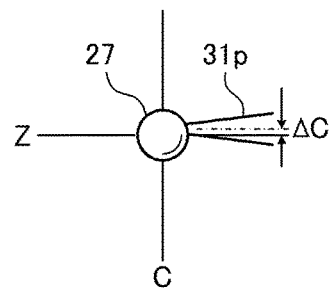
Figure 12B:
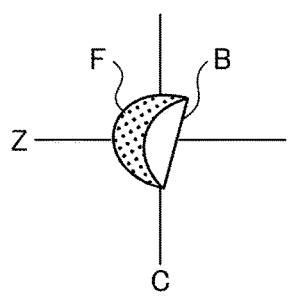
Figure 12E:
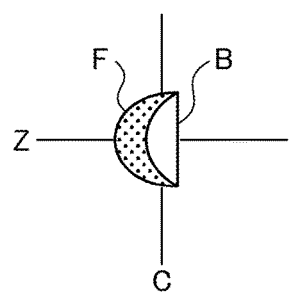
Figure 12H:
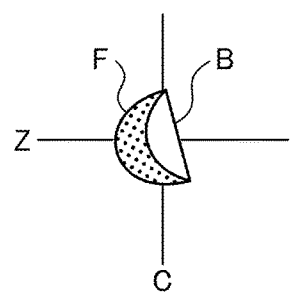
Figure 12C:
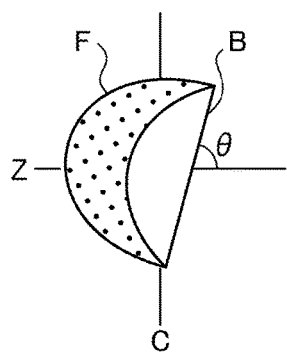
Figure 12F:
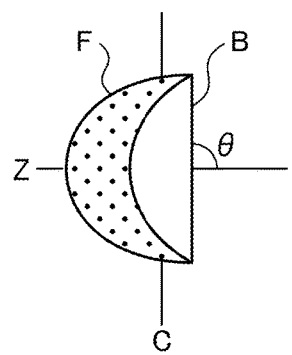
Figure 12I:
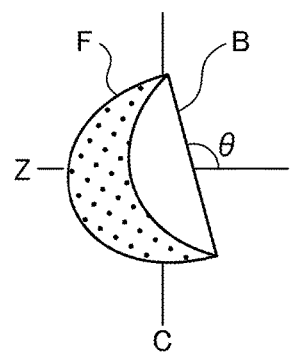

FIGS. 12A to 12I describe a principle of calculating the position of the optical path of the pre-pulse laser beam 31p in the vicinity of the plasma generation region 25 based on the image of the target immediately after being irradiated with the pre-pulse laser beam 31p. FIGS. 12A to 12C show the images photographed by the target camera 80d in the case where the target 27 is irradiated with the pre-pulse laser beam 31p at a shifted position of the spherical surface of the target 27. This shifted position may be shifted in the C direction from the center of the target 27. FIGS. 12D to 12F show the images photographed by the target camera 80d in the case where the target 27 is irradiated with the pre-pulse laser beam 31p at substantially the center of the spherical target 27. FIGS. 12G to 12I show the images photographed by the target camera 80d in the case where the target 27 is irradiated with the pre-pulse laser beam 31p at a shifted position of the spherical surface of the target 27. This shifted position may be shifted in the −C direction from the center of the target 27. FIGS. 12A, 12D, and 12G show the images of the target being irradiated with the pre-pulse laser beam 31p. FIGS. 12B, 12E, and 12H show silhouette images of the target diffused in dome-shape by being irradiated with the pre-pulse laser beam 31p. FIGS. 12C, 12F, and 12I show magnified images of the diffused target shown in FIGS. 12B, 12E, and 12H, respectively.

Irradiating the target 27 with the pre-pulse laser beam 31p in the Z direction may cause rapid laser ablation at the −Z side surface of the target 27 to break and diffuse the target in a dome shape. The silhouette image of the target diffused in a dome-shape may include a curved portion F at the Z side of the target and a substantially straight portion B at the −Z side of the target.

As shown in FIGS. 12D to 12F, if the pre-pulse laser beam 31p is applied to substantially the center of the target 27, a silhouette image of the target diffused in a dome-shape may be substantially symmetric with the Z-axis. The substantially straight portion B may be substantially perpendicular to the Z direction.

As shown in FIGS. 12A to 12C, if the pre-pulse laser beam 31p is applied to the target 27 in a position shifted in the C direction from the center of the target 27, the substantially straight portion B may be slightly inclined clockwise against a plane perpendicular to the Z direction. The shift amount of the pre-pulse laser beam 31p from the center of the target 27 along the C-axis may be represented by ΔC. The angle of the portion B against the Z-axis may be represented by θ.

As shown in FIGS. 12G to 12I, if the pre-pulse laser beam 31p is applied to the target 27 in a position shifted in the −C direction from the center of the target 27, the substantially straight portion B may be slightly inclined counterclockwise against a plane perpendicular to the Z direction.

A relationship between the shift amount ΔC of the pre-pulse laser beam 31p and the angle θ of the substantially straight portion B and the Z-axis may be measured in advance. Then, actually photographed image data may be compared with the relationship. The position of the optical path of the pre-pulse laser beam 31p in the vicinity of the plasma generation region 25 may thus be calculated.

In the other aspects, the third embodiment may be substantially the same as the first or second embodiment.

Figure 13:
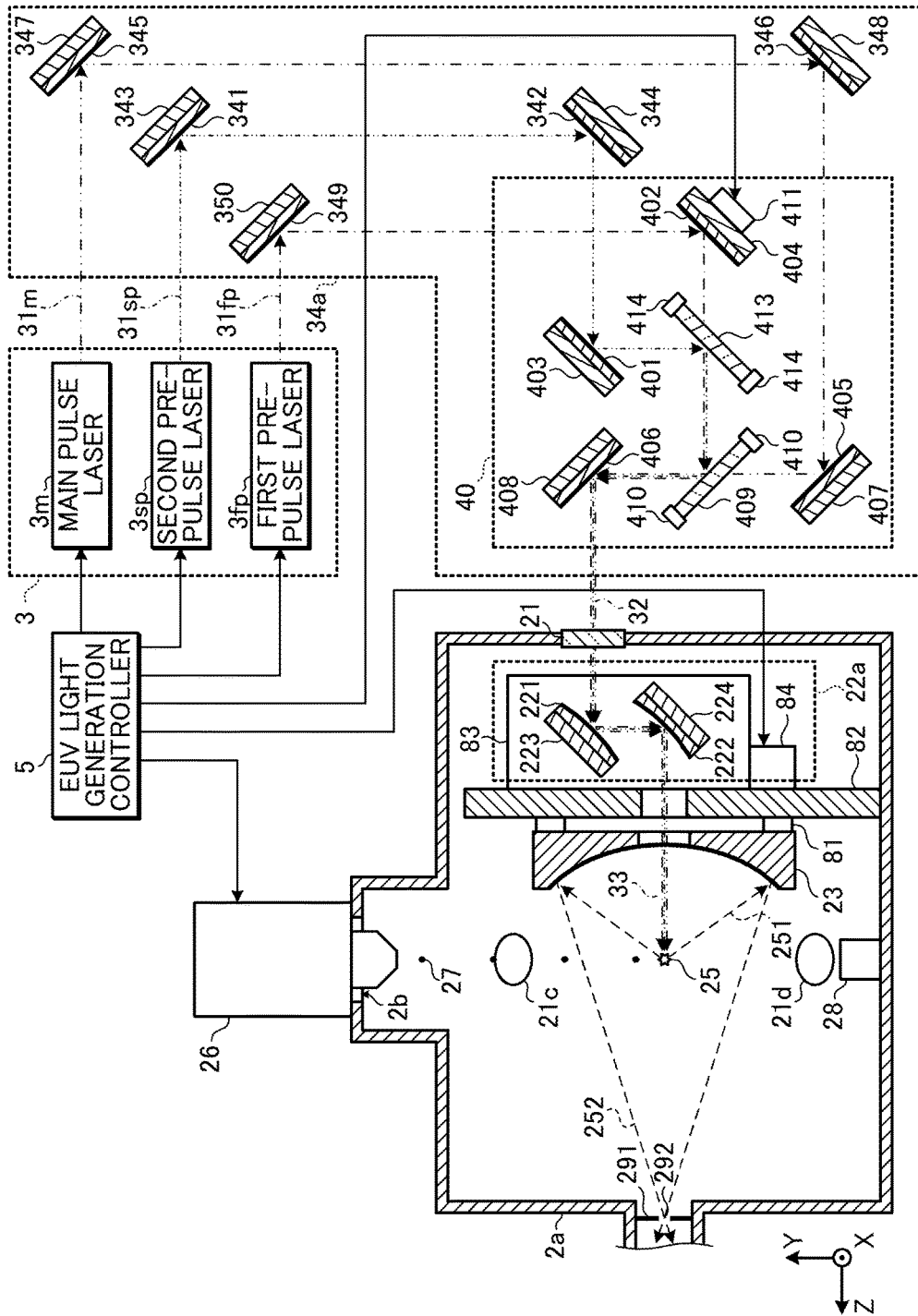
FIG. 13 schematically shows a configuration of an EUV light generating system according to a fourth embodiment of the present disclosure.

6. EUV Light Generating Apparatus to Irradiate One Target with Two Pre-Pulse Laser Beams and One Main Pulse Laser Beam 6.1 Configuration FIG. 13 schematically shows a configuration of an EUV light generating system according to a fourth embodiment of the present disclosure. In the fourth embodiment, the laser apparatus 3 may include a first pre-pulse laser 3fp, a second pre-pulse laser 3sp, and a main pulse laser 3m.

The first pre-pulse laser 3fp may be configured to output a first pre-pulse laser beam 31fp according to a control signal outputted from the EUV light generation controller 5. The second pre-pulse laser 3sp may be configured to output a second pre-pulse laser beam 31sp according to a control signal outputted from the EUV light generation controller 5.

The first pre-pulse laser beam 31fp may correspond to a first pulse laser beam in the present disclosure. The second pre-pulse laser beam 31sp and the main pulse laser beam 31m may correspond to second pulse laser beams in the present disclosure.

The laser beam direction control unit 34a may include a high-reflective mirror 349. The beam combiner module 40 included in the laser beam direction control unit 34a may include a beam combiner 413.

The high-reflective mirror 349 may be provided in an optical path of the first pre-pulse laser beam 31fp outputted from the first pre-pulse laser 3fp. The high-reflective mirror 349 may be held by a holder 350. The high-reflective mirror 402 may be provided in an optical path of the first pre-pulse laser beam 31fp reflected by the high-reflective mirror 349. The high-reflective mirror 402 may be capable of changing its posture by the high-speed actuator 411.

The high-reflective mirror 341 may be provided in an optical path of the second pre-pulse laser beam 31sp outputted from the second pre-pulse laser 3sp. The high-reflective mirror 342 may be provided in an optical path of the second pre-pulse laser beam 31sp reflected by the high-reflective mirror 341. The high-reflective mirror 401 may be provided in an optical path of the second pre-pulse laser beam 31sp reflected by the high-reflective mirror 342.

The beam combiner 413 may be provided in an intersecting position where the optical path of the first pre-pulse laser beam 31fp reflected by the high-reflective mirror 402 and the optical path of the second pre-pulse laser beam 31sp reflected by the high-reflective mirror 401 intersect with each other. The beam combiner 413 may be held by a holder 414.

The beam combiner 413 may be configured by a polarizing beam splitter. The polarizing direction of the first pre-pulse laser beam 31fp and that of the second pre-pulse laser beam 31sp may be substantially perpendicular to each other at the surface of the beam combiner 413. The beam combiner 413 may transmit the first pre-pulse laser beam 31fp at a high transmittance and reflect the second pre-pulse laser beam 31sp at a high reflectance. The beam combiner 413 may cause the central axis of the optical path of the first pre-pulse laser beam 31fp and that of the second pre-pulse laser beam 31sp to substantially coincide with each other.

The beam combiner 409 may be provided in an intersecting position where the optical paths of the first and second pre-pulse laser beams 31fp and 31sp both emitted from the beam combiner 413 and the optical path of the main pulse laser beam 31m reflected by the high-reflective mirror 405 intersect with each other.

The beam combiner 409 may be configured by a dichroic mirror. The wavelength of the first pre-pulse laser beam 31fp and that of the second pre-pulse laser beam 31sp may be substantially the same with each other. The wavelength of the main pulse laser beam 31m may be longer than that of each of the first and second pre-pulse laser beams 31fp and 31sp. The beam combiner 409 may reflect the first and second pre-pulse laser beams 31fp and 31sp at a high reflectance and transmit the main pulse laser beam 31m at a high transmittance. The beam combiner 409 may cause the central axes of the optical paths of the first and second pre-pulse laser beams 31*fp* and 31*sp* and the central axis of the optical path of the main pulse laser beam 31*m* to substantially coincide with each other.

The beam combiner 413 may correspond to a first beam combiner according to the present disclosure. The beam combiner 409 may correspond to a second beam combiner according to the present disclosure.

The laser beam focusing optical system 22*a* may be provided in the optical paths of the first pre-pulse laser beam 31*fp*, the second pre-pulse laser beam 31*sp*, and the main pulse laser beam 31*m* emitted from the laser beam direction control unit 34*a*. The laser beam focusing optical system 22*a* may be capable of changing its position by the actuator 84 for the laser beam focusing optical system.

In other aspects, the fourth embodiment may have substantially the same configuration as that of the first embodiment described above with reference to FIG. 6.

6.2 Operation

The first pre-pulse laser beam 31*fp*, the second pre-pulse laser beam 31*sp*, and the main pulse laser beam 31*m* may travel through the laser beam direction control unit 34*a*. These beams may then be concentrated by the laser beam focusing optical system 22*a* to the plasma generation region 25 as the pulse laser beam 33.

The spot diameter of the first pre-pulse laser beam 31*fp* concentrated by the laser beam focusing optical system 22*a* may be smaller than that of each of the second pre-pulse laser beam 31*sp* and the main pulse laser beam 31*m*. The spot diameter of the second pre-pulse laser beam 31*sp* concentrated by the laser beam focusing optical system 22*a* may be substantially the same as that of the main pulse laser beam 31*m*.

The energy of the main pulse laser beam 31*m* may be higher than that of each of the first and second pre-pulse laser beams 31*fp* and 31*sp*. The pulse width of the first pre-pulse laser beam 31*fp* may be shorter than that of each of the second pre-pulse laser beam 31*sp* and the main pulse laser beam 31*m*.

At a point in time when the target 27 reaches the plasma generation region 25, the target 27 may be irradiated with the first pre-pulse laser beam 31*fp*. The target 27 irradiated with the first pre-pulse laser beam 31*fp* may expand or diffuse to turn into a secondary target. At a point in time when the secondary target expands or diffuses to a desired size, the secondary target may be irradiated with the second pre-pulse laser beam 31*sp*. Deviation of particles of the secondary target in the space where the particles dispersed may be smaller in the secondary target after being irradiated with the second pre-pulse laser beam 31*sp* than in the secondary target before being irradiated with the second pre-pulse laser beam 31*sp*. The secondary target may then be irradiated with the main pulse laser beam 31*m*. The secondary target irradiated with the main pulse laser beam 31*m* may turn into plasma. The plasma may emit the rays of light 251 including the EUV light.

The high-speed actuator 411 and the actuator 84 for the laser beam focusing optical system may both be controlled as in the first embodiment.

Alternatively, the actuator 412 for the mirror, in place of the actuator 84 for the laser beam focusing optical system, may be controlled as in the second embodiment.

Alternatively, control may be performed based on the image data from the target cameras 80*c* and 80*d*, in place of the data from the EUV light sensors 70*c* to 70*e*, as in the third embodiment. The image data used in this control may be obtained by photographing the secondary target before being irradiated with the second pre-pulse laser beam 31*sp*. The image data may alternatively be obtained by photographing the secondary target after being irradiated with the second pre-pulse laser beam 31*sp* and before being irradiated with the main pulse laser beam 31*m*.

6.3 Effect

In the fourth embodiment, the target 27 may be irradiated with the first pre-pulse laser beam 31*fp*, the second pre-pulse laser beam 31*sp*, and the main pulse laser beam mp. The high-reflective mirror 402 whose posture is controlled by the high-speed actuator 411 may be provided in the optical path of the first pre-pulse laser beam 31*fp*. Accuracy in the position of the optical path of the first pre-pulse laser beam 31*fp* in the vicinity of the plasma generation region 25 may thus be improved.

The spot diameter of the first pre-pulse laser beam 31*fp* may be smaller than that of each of the second pre-pulse laser beam 31*sp* and the main pulse laser beam 31*m*. Improving the accuracy in the position of the optical path of the first pre-pulse laser beam 31*fp* in the vicinity of the plasma generation region 25 may thus cause the energy of the EUV light to be stabilized.

The fourth embodiment may be applied in the case where one target 27 is irradiated with three pre-pulse laser beams and a main pulse laser beam. In that case, a first pre-pulse laser beam, with which the target 27 is firstly irradiated to generate the secondary target, of the three pre-pulse laser beams may correspond to a first pulse laser beam in the present disclosure. A second pre-pulse laser beam, a third pre-pulse laser beam, and the main pulse laser beam with which the secondary target is irradiated may correspond to second pulse laser beams in the present disclosure.

Figure 14:
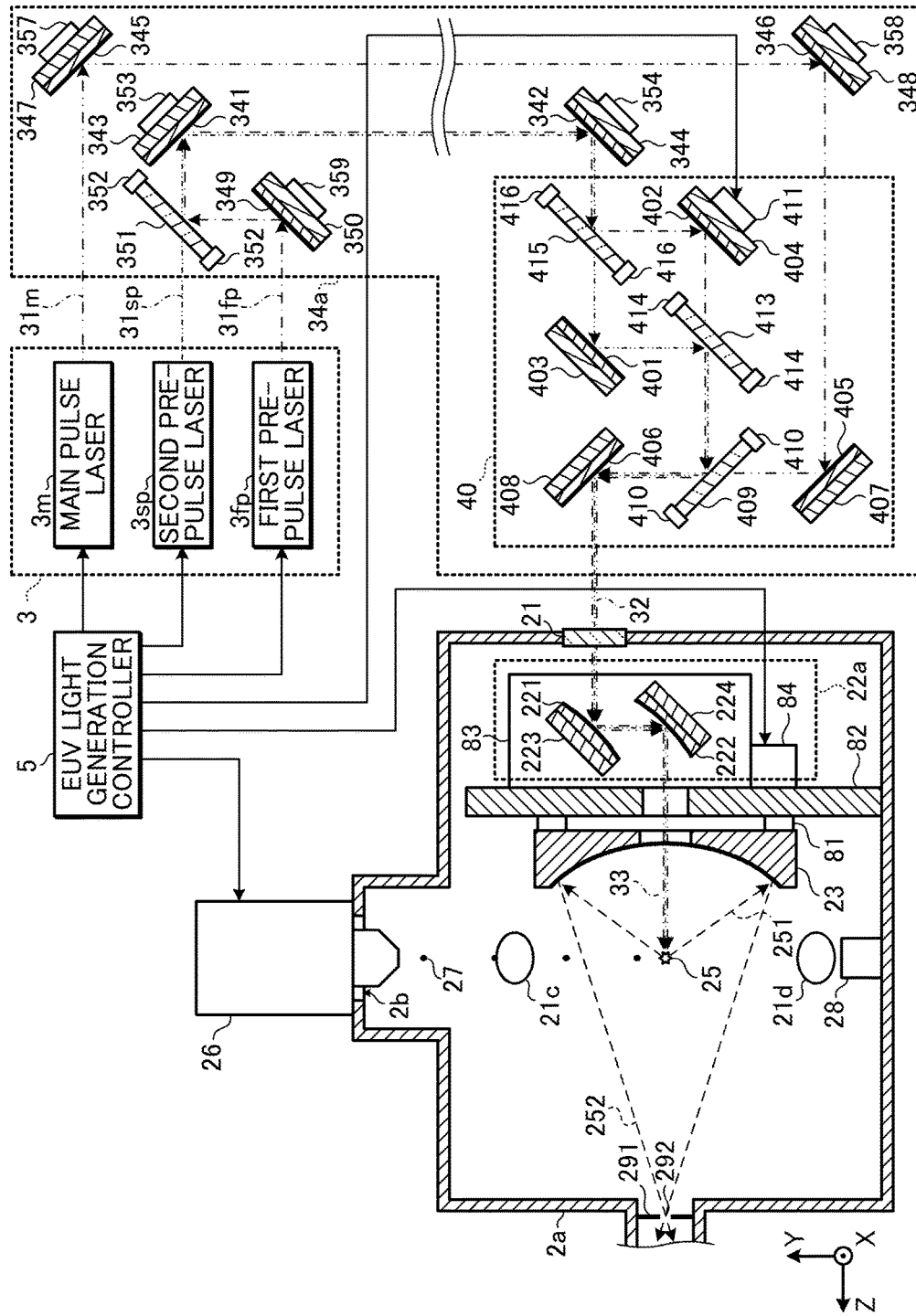
FIG. 14 schematically shows a configuration of an EUV light generating system according to a fifth embodiment of the present disclosure.

7. EUV Light Generating Apparatus Performing Long-Distance Delivery of Two Pre-Pulse Laser Beams and One Main Pulse Laser Beam 7.1 Configuration FIG. 14 schematically shows a configuration of an EUV light generating system according to a fifth embodiment of the present disclosure. In the fifth embodiment, the laser beam direction control unit 34*a* may include a beam combiner 351. The beam combiner module 40 in the laser beam direction control unit 34*a* may include a beam splitter 415.

The high-reflective mirror 349 may be provided in an optical path of the first pre-pulse laser beam 31*fp* outputted from the first pre-pulse laser 3*fp*. The high-reflective mirror 349 and the holder 350 holding the high-reflective mirror 349 may be capable of changing their postures by an actuator 359.

The beam combiner 351 may be provided in an intersecting position where the optical path of the first pre-pulse laser beam 31*fp* reflected by the high-reflective mirror 349 and the optical path of the second pre-pulse laser beam 31*sp* outputted from the second pre-pulse laser 3*sp* intersect with each other. The beam combiner 351 may be held by a holder 352.

The beam combiner 351 may be configured by a polarizing beam splitter. The polarizing direction of the first pre-pulse laser beam 31*fp* and that of the second pre-pulse laser beam 31*sp* may be substantially perpendicular to each other at the surface of the beam combiner 351. The beam combiner 351 may reflect the first pre-pulse laser beam 31*fp* at a high reflectance and transmit the second pre-pulse laser beam 31*sp* at a high transmittance. The beam combiner 351 may cause the central axis of the optical path of the first pre-pulse laser beam 31*fp* and that of the second pre-pulse laser beam 31*sp* to substantially coincide with each other.

The beam combiner 351 may correspond to a third beam combiner in the present disclosure.

An unillustrated optical sensor may be provided at a position in the optical paths of the first and second pre-pulse laser beams 31*fp* and 31*sp* emitted from the beam combiner 351. The optical sensor may detect the beam position and the pointing of each of the first and second pre-pulse laser beams 31*fp* and 31*sp* emitted from the beam combiner 351. Based on the output from the optical sensor, the actuator 359 may be controlled to keep the central axes of the optical paths of the first and second pre-pulse laser beams 31*fp* and 31*sp* emitted from the beam combiner 351 substantially coinciding with each other.

The high-reflective mirror 341 may be provided in the optical paths of the first and second pre-pulse laser beams 31*fp* and 31*sp* emitted from the beam combiner 351. The high-reflective mirror 341 and the holder 343 holding the high-reflective mirror 341 may be capable of changing their postures by an actuator 353.

An unillustrated optical sensor may be provided at a position in the optical paths of the first and second pre-pulse laser beams 31*fp* and 31*sp* reflected by the high-reflective mirror 341. The optical sensor may detect the beam position and the pointing of each of the first and second pre-pulse laser beams 31*fp* and 31*sp* reflected by the high-reflective mirror 341. Based on the output from the optical sensor, the actuator 353 may be controlled such that the first and second pre-pulse laser beams 31*fp* and 31*sp* are incident on a desired position of the high-reflective mirror 342.

The high-reflective mirror 342 may be provided in the optical paths of the first and second pre-pulse laser beams 31*fp* and 31*sp* reflected by the high-reflective mirror 341. The high-reflective mirror 342 and the holder 344 holding the high-reflective mirror 342 may be capable of changing their postures by an actuator 354.

An unillustrated optical sensor may be provided at a position in the optical paths of the first and second pre-pulse laser beams 31*fp* and 31*sp* reflected by the high-reflective mirror 342. The optical sensor may detect the beam position and the pointing of each of the first and second pre-pulse laser beams 31*fp* and 31*sp* reflected by the high-reflective mirror 342. Based on the output from the optical sensor, the actuator 354 may be controlled such that the first and second pre-pulse laser beams 31*fp* and 31*sp* are incident on a desired position of the beam combiner module 40.

The optical paths of the first and second pre-pulse laser beams 31*fp* and 31*sp* between the high-reflective mirrors 341 and 342 may have a length of tens of meters. A plurality of unillustrated high-reflective mirrors may be provided in the optical paths of the first and second pre-pulse laser beams 31*fp* and 31*sp* between the high-reflective mirrors 341 and 342.

The high-reflective mirror 345 and the holder 347 holding the high-reflective mirror 345 may be capable of changing their postures by an actuator 357.

An unillustrated optical sensor may be provided at a position in the optical path of the main pulse laser beam 31*m* reflected by the high-reflective mirror 345. The optical sensor may detect the beam position and the pointing of the main pulse laser beam 31*m* reflected by the high-reflective mirror 345. Based on the output from the optical sensor, the actuator 357 may be controlled such that the main pulse laser beam 31*m* is incident on a desired position of the high-reflective mirror 346.

The high-reflective mirror 346 and the holder 348 holding the high-reflective mirror 346 may be capable of changing their postures by an actuator 358.

An unillustrated optical sensor may be provided in a position in the optical path of the main pulse laser beam 31*m* reflected by the high-reflective mirror 346. The optical sensor may detect the beam position and the pointing of the main pulse laser beam 31*m* reflected by the high-reflective mirror 346. Based on the output from the optical sensor, the actuator 358 may be controlled such that the main pulse laser beam 31*m* is incident on a desired position of the beam combiner module 40.

The optical path of the main pulse laser beam 31*m* between the high-reflective mirrors 345 and 346 may have a length of tens of meters. A plurality of unillustrated high-reflective mirrors may be provided in the optical path of the main pulse laser beam 31*m* between the high-reflective mirrors 345 and 346.

The actuators 359, 353, 354, 357, and 358 may be controlled by the EUV light generation controller 5. The optical sensors to acquire the data for controlling these actuators may be provided in the beam combiner module 40.

The beam splitter 415 may be provided in the optical paths of the first and second pre-pulse laser beams 3lfp and 31*sp* reflected by the high-reflective mirror 342. The beam splitter 415 may be held by a holder 416. The beam splitter 415 may be configured by a polarizing beam splitter. The beam splitter 415 may reflect the first pre-pulse laser beam 31*fp* at a high reflectance to emit the first pre-pulse laser beam 3lfp along a first optical path. The beam splitter 415 may transmit the second pre-pulse laser beam 31*sp* at a high transmittance to emit the second pre-pulse laser beam 31*sp* along a second optical path.

The high-reflective mirror 402 may be provided in the first optical path of the first pre-pulse laser beam 31*fp* reflected by the beam splitter 415.

The high-reflective mirror 401 may be provided in the second optical path of the second pre-pulse laser beam 31*sp* transmitted by the beam splitter 415.

The beam combiner 413 may be provided in an intersecting position where the optical path of the first pre-pulse laser beam 31*fp* reflected by the high-reflective mirror 402 and the optical path of the second pre-pulse laser beam 31*sp* reflected by the high-reflective mirror 401 intersect with each other.

In the other aspects, the fifth embodiment may have substantially the same configuration as that in the fourth embodiment described with reference to FIG. 13.

7.2 Operation

The central axis of the optical path of the first pre-pulse laser beam 31*fp* and that of the second pre-pulse laser beam 31*sp* may be caused to substantially coincide with each other by the beam combiner 351. The first pre-pulse laser beam 31*fp* and the second pre-pulse laser beam 31*sp* may then be reflected by the high-reflective mirrors 341 and 342 and be incident on the beam splitter 415.

The beam splitter 415 may separate the optical paths of the first pre-pulse laser beam 31*fp* and the second pre-pulse laser beam 31*sp* from each other. The first pre-pulse laser beam 31*fp* emitted from the beam splitter 415 may be reflected by the high-reflective mirror 402. The posture of the high-reflective mirror 402 may be controlled by the high-speed actuator 411. The beam combiner 413 may cause the central axis of the optical path of the first pre-pulse laser beam 31*fp* and that of the second pre-pulse laser beam 31*sp* to substantially coincide with each other.

In the other aspects, the fifth embodiment may be substantially the same as the fourth embodiment in its operation.

7.3 Effect

According to the fifth embodiment, the high-reflective mirror 341, the high-reflective mirror 342, and the other optical elements between them may be commonly used for the first and second pre-pulse laser beams 31*fp* and 31*sp*. Commonly using the optical elements may be preferable in the case where the wavelengths of the first and second pre-pulse laser beams 31*fp* and 31*sp* are substantially the same with each other. Commonly using the optical elements may achieve a significant reduction of the number of components including mirrors in the case where the first and second pre-pulse laser beams 31*fp* and 31*sp* are delivered over a long distance.

In the fifth embodiment, the actuators 353 and 354 may perform the control of the optical path axes of the first and second pre-pulse laser beams 31*fp* and 31*sp*. This may cause the control of the optical path axes of the first and second pre-pulse laser beams 31*fp* and 31*sp* just before the beam combiner module 40 to be common and simple.

The beam splitter 415 may separate the optical paths of the first pre-pulse laser beam 31*fp* and the second pre-pulse laser beam 31*sp* from each other. This may achieve accurate control of the position of the optical path of the first pre-pulse laser beam 31*fp* using the high-speed actuator 411. Further, the beam combiner 413 may cause the central axis of the optical path of the first pre-pulse laser beam 31*fp* and that of the second pre-pulse laser beam 31*sp* to substantially coincide with each other. This may achieve concentrating these pre-pulse laser beams in the vicinity of the plasma generation region 25.

8. Configuration of Controller

Figure 15:
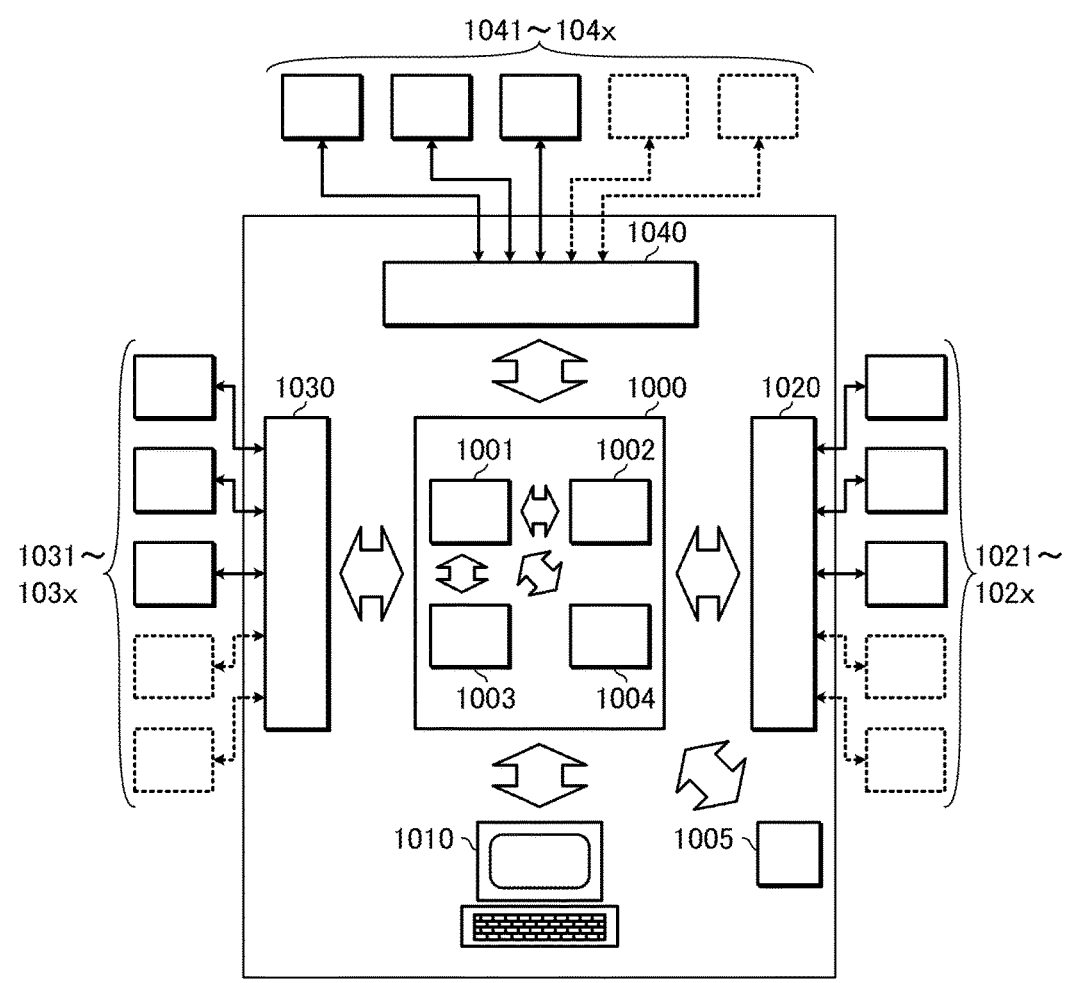
FIG. 15 is a block diagram showing a general configuration of a controller.

FIG. 15 is a block diagram showing a general configuration of the controller.

Controllers of the embodiments described above, such as the EUV light generation controller 5, may be configured by general-purpose control devices, such as computers or programmable controllers. For example, the controllers may be configured as follows.

Configuration

The controllers may each be configured by a processor 1000, and a storage memory 1005, a user interface 1010, a parallel input/output (I/O) controller 1020, a serial I/O controller 1030, and an analog-to-digital (A/D) and digital-to-analog (D/A.) converter 1040 which are connected to the processor 1000. The processor 1000 may be configured by a central processing unit (CPU) 1001, and a memory 1002, a timer 1003, and a graphics processing unit (GPU) 1004 which are connected to the CPU 1001.

Operation

The processor 1000 may read a program stored in the storage memory 1005, execute the read program, read data from the storage memory 1005 in accordance with the program, or store data in the storage memory 1005.

The parallel I/O controller 1020 may be connected to devices 1021 to 102*x* with which it may communicate through parallel I/O ports. The parallel I/O controller 1020 may control digital-signal communication through the parallel I/O ports while the processor 1000 executes the program.

The serial. I/O controller 1030 may be connected to devices 1031 to 103*x* with which it may communicate through serial I/O ports. The serial I/O controller 1030 may control digital-signal communication through the serial I/O ports while the processor 1000 executes the program.

The A/D and D/A converter 1040 may be connected to devices 1041 to 104*x* with which it may communicate through analog ports. The A/D and D/A converter 1040 may control analog-signal communication through the analog ports while the processor 1000 executes the program.

The user interface 1010 may be configured to display the progress of the program being executed by the processor 1000 in accordance with instructions from an operator, or to allow the processor 1000 to stop the execution of the program or perform an interrupt in accordance with instructions from the operator.

The CPU 1001 of the processor 1000 may perform arithmetic processing of the program. The memory 1002 may temporarily store the program being executed by the CPU 1001 or temporarily store data in the arithmetic processing. The timer 1003 may measure time or elapsed time and output it to the CPU 1001 in accordance with the program being executed. When image data is inputted to the processor 1000, the GPU 1004 may process the image data in accordance with the program being executed and output the results to the CPU 1001.

The devices 1021 to 102*x*, which are connected through the parallel I/O ports to the parallel I/O controller 1020, may be the laser apparatus 3, the exposure apparatus 6, other controllers, or the like.

The devices 1031 to 103*x*, which are connected through the serial I/O ports to the serial I/O controller 1030, may be the target supply unit 26, the actuator 84 for the laser beam focusing optical system, the high-speed actuator 411, or the like.

The devices 1041 to 104*x*, which are connected through the analog ports to the A/D and D/A converter 1040, may be various sensors such as the EUV light sensors 70*c* to 70*e*, or the like.

The controllers thus configured may be capable of realizing the operations described in the embodiments.

The above descriptions are intended to be only illustrative rather than being limiting. Accordingly, it will be clear to those skilled in the art that various changes may be made to the embodiments of the present disclosure without departing from the scope of the appended claims.

The terms used in this specification and the appended claims are to be interpreted as not being limiting. For example, the term "include" or "included" should be interpreted as not being limited to items described as being included. Further, the term "have" should be interpreted as not being limited to items described as being had. Furthermore, the modifier "a" or "an" as used in this specification and the appended claims should be interpreted as meaning "at least one" or "one or more".

The invention claimed is:

1. An extreme ultraviolet light generating apparatus comprising:
    a chamber including a window configured to allow a first pulse laser beam with which a target is irradiated at a predetermined region to generate a secondary target and a second pulse laser beam with which the secondary target is irradiated at the predetermined region to generate plasma to enter;
    a mirror configured to reflect the first pulse laser beam;
    a first actuator configured to control at least one of a position and a posture of the mirror;
    a beam combiner configured to cause optical paths of the first pulse laser beam reflected by the mirror and the second pulse laser beam to substantially coincide with each other to output the first pulse laser beam and the second pulse laser beam;

a reflective optical system configured to reflect the first pulse laser beam and the second pulse laser beam outputted from the beam combiner toward the predetermined region;

a second actuator configured to control at least one of a position and a posture of the reflective optical system;

sensors each configured to output data for detecting a position of an optical path of the first pulse laser beam in the vicinity of the predetermined region; and a controller configured to control the first actuator based on the data and control the second actuator based on a value related to control of the first actuator.

2. The extreme ultraviolet light generating apparatus according to claim 1, wherein the sensors are arranged in a single plane perpendicular to an optical path axis of the first pulse laser beam in the vicinity of the predetermined region.

3. The extreme ultraviolet light generating apparatus according to claim 1, wherein each of the sensors receives light emitted from the plasma to output the data.

4. The extreme ultraviolet light generating apparatus according to claim 1, wherein each of the sensors photographs the secondary target to output the data.

5. The extreme ultraviolet light generating apparatus according to claim 1, wherein the reflective optical system concentrates the first pulse laser beam and the second pulse laser beam to the predetermined region.

6. The extreme ultraviolet light generating apparatus according to claim 1, wherein the controller controls the first actuator at a higher frequency than it controls the second actuator.

7. The extreme ultraviolet light generating apparatus according to claim 1, wherein a response speed of the first actuator is faster than that of the second actuator.

8. The extreme ultraviolet light generating apparatus according to claim 1, wherein a range of adjustment of the optical path of the first pulse laser beam with the first actuator is larger than that with the second actuator.

9. An extreme ultraviolet light generating apparatus comprising:

a chamber including a window configured to allow a first pulse laser beam with which a target is irradiated at a predetermined region to generate a secondary target and second pulse laser beams with which the secondary target is irradiated at the predetermined region to generate plasma to enter;

a mirror configured to reflect the first pulse laser beam;

a first actuator configured to control at least one of a position and a posture of the mirror;

at least one beam combiner configured to cause optical paths of the first pulse laser beam reflected by the mirror and the second pulse laser beams to substantially coincide with each other to output the first pulse laser beam and the second pulse laser beams;

a reflective optical system configured to reflect the first pulse laser beam and the second pulse laser beams outputted from the beam combiner toward the predetermined region;

a second actuator configured to control at least one of a position and a posture of the reflective optical system;

sensors each configured to output data for detecting a position of an optical path of the first pulse laser beam in the vicinity of the predetermined region; and a controller configured to control the first actuator based on the data and control the second actuator based on a value related to control of the first actuator.

10. The extreme ultraviolet light generating apparatus according to claim 9, wherein the first pulse laser beam includes a first pre-pulse laser beam, the second pulse laser beams include a second pre-pulse laser beam and a main pulse laser beam, the secondary target is irradiated with the second pre-pulse laser beam, and the secondary target is further irradiated with the main pulse laser beam after being irradiated with the second pre-pulse laser beam.

11. The extreme ultraviolet light generating apparatus according to claim 10, wherein the at least one beam combiner includes:

a first beam combiner configured to cause optical paths of the first pre-pulse laser beam reflected by the mirror and the second pre-pulse laser beam to substantially coincide with each other to output the first pre-pulse laser beam and the second pre-pulse laser beam; and a second beam combiner configured to cause optical paths of the first and second pre-pulse laser beams outputted from the first beam combiner and the main pulse laser beam to substantially coincide with each other to output the first and second pre-pulse laser beams and the main pulse laser beam.

12. The extreme ultraviolet light generating apparatus according to claim 11, further comprising:

a third beam combiner configured to cause optical paths of the first pre-pulse laser beam and the second pre-pulse laser beam to substantially coincide with each other to output the first pre-pulse laser beam and the second pre-pulse laser beam; and a beam splitter configured to output the first pre-pulse laser beam outputted from the third beam combiner along a first optical path toward the mirror, and output the second pre-pulse laser beam outputted from the third beam combiner along a second optical path toward the first beam combiner.

13. The extreme ultraviolet light generating apparatus according to claim 10, wherein each of the sensors photographs the secondary target before being irradiated with the second pre-pulse laser beam to output the data.

14. The extreme ultraviolet light generating apparatus according to claim 10 wherein each of the sensors photographs the secondary target after being irradiated with the second pre-pulse laser beam. to output the data.

15. The extreme ultraviolet light generating apparatus according to claim 9, wherein the sensors are arranged in a single plane perpendicular to an optical path axis of the first pulse laser beam in the vicinity of the predetermined region.

16. The extreme ultraviolet light generating apparatus according to claim 9, wherein each of the sensors receives light emitted from the plasma to output the data.

17. The extreme ultraviolet light generating apparatus according to claim 9, wherein the reflective optical system concentrates the first pulse laser beam and the second pulse laser beams to the predetermined region.

18. The extreme ultraviolet light generating apparatus according to claim 9, wherein the controller controls the first actuator at a higher frequency than it controls the second actuator.

19. The extreme ultraviolet light generating apparatus according to claim 9, wherein a response speed of the first actuator is faster than that of the second actuator.

20. The extreme ultraviolet light generating apparatus according to claim 9, wherein a range of adjustment of the optical path of the first pulse laser beam with the first actuator is larger than that with the second actuator.

* * * * *